(12) United States Patent
Landesberger

(10) Patent No.: US 10,304,714 B2
(45) Date of Patent: May 28, 2019

(54) DEVICE COMPRISING FILM FOR ELECTROSTATIC COUPLING OF A SUBSTRATE TO A SUBSTRATE CARRIER

(71) Applicant: Fraunhofer-Gesellschaft zur Foerderung der angewandten Forschung e.V., Munich (DE)

(72) Inventor: Christof Landesberger, Graefelfing (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/833,735

(22) Filed: Dec. 6, 2017

(65) Prior Publication Data
US 2018/0108557 A1 Apr. 19, 2018

Related U.S. Application Data

(63) Continuation of application No. PCT/EP2016/063347, filed on Jun. 10, 2016.

(30) Foreign Application Priority Data

Jun. 11, 2015 (DE) .................. 10 2015 210 736

(51) Int. Cl.
*H01T 23/00* (2006.01)
*H01L 21/683* (2006.01)

(52) U.S. Cl.
CPC ...... *H01L 21/6833* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 4,724,510 A | 2/1988 | Wicker et al. | |
| 5,275,683 A | 1/1994 | Arami et al. | |
| 5,315,473 A | 5/1994 | Collins et al. | |
| 5,691,876 A | 11/1997 | Chen et al. | |
| 6,185,085 B1 * | 2/2001 | Hwang | H01L 21/6831 |
| | | | 361/234 |

(Continued)

FOREIGN PATENT DOCUMENTS

| DE | 20311625 U1 | 11/2003 |
|---|---|---|
| DE | 10255889 A1 | 6/2004 |

(Continued)

*Primary Examiner* — Stephen W Jackson
(74) *Attorney, Agent, or Firm* — Perkins Coie LLP; Michael A. Glenn

(57) ABSTRACT

The invention relates to an apparatus for electrostatic coupling of a substrate with a substrate carrier, wherein the apparatus includes a flexible plastic carrier film on which an electrically contactable electrode structure is unilaterally deposited, and a cover layer which can be brought into contact with the electrode structure on the side of the electrode structure facing away from the carrier film, wherein the apparatus is configured such that, in a coupled state, the same is arranged at least in sections between the substrate and the substrate carrier and, in a non-coupled state, the same can be removed from the substrate carrier in a reusable manner.

23 Claims, 14 Drawing Sheets

(56) References Cited

U.S. PATENT DOCUMENTS

| | | | |
|---|---|---|---|
| 6,376,795 B1 * | 4/2002 | Zola | B23Q 3/154 |
| | | | 219/121.4 |
| 7,027,283 B2 | 4/2006 | Landesberger et al. | |
| 7,733,624 B2 * | 6/2010 | Landesberger | H01L 21/6833 |
| | | | 361/230 |
| 2003/0000820 A1 | 1/2003 | Nelson et al. | |
| 2004/0187791 A1 | 9/2004 | Busse et al. | |
| 2010/0309603 A1 | 12/2010 | Poh | |
| 2012/0120545 A1 | 5/2012 | Fujisawa et al. | |

FOREIGN PATENT DOCUMENTS

| | | |
|---|---|---|
| DE | 202004010351 U1 | 9/2004 |
| DE | 102004041049 A1 | 1/2006 |
| EP | 0486966 A1 | 5/1992 |
| EP | 1458019 A2 | 9/2004 |
| EP | 1305821 B1 | 10/2008 |
| JP | H02135141 U | 11/1990 |
| JP | H0647642 U | 6/1994 |
| JP | H0746437 Y2 | 10/1995 |
| JP | H09162272 A | 6/1997 |
| JP | 3596127 B2 | 12/2004 |
| JP | 2007294852 A | 11/2007 |
| JP | 2009099674 A | 5/2009 |
| WO | 2011001978 A1 | 1/2011 |

* cited by examiner

US 10,304,714 B2

DEVICE COMPRISING FILM FOR ELECTROSTATIC COUPLING OF A SUBSTRATE TO A SUBSTRATE CARRIER

CROSS-REFERENCE TO RELATED APPLICATIONS

This application is a continuation of copending International Application No. PCT/EP2016/063347, filed Jun. 10, 2016, which is incorporated herein by reference in its entirety, and additionally claims priority from German Application No. 102015210736.1, filed Jun. 11, 2015, which is also incorporated herein by reference in its entirety.

The invention relates to an apparatus for electrostatic coupling of a substrate to a substrate carrier according to the features of claim 1, as well as to a substrate stack according to claim 23 and to a usage of such an apparatus having the features of claim 24.

BACKGROUND OF THE INVENTION

Very thin and/or fragile semiconductor wafers, such as wafers of Si, GaAs, InP, GaN, etc., or thin glass or ceramic substrates, such as of SiC, are widely used in microelectronics. The term "wafer" typically relates to semiconductor substrates having a round shape with a defined diameter, such as 100 mm, 150 mm, 200 mm, 300 mm, 450 mm.

For many fields of application, these wafers have to become very thin, e.g., 10 μm to 100 μm and have to pass through processing steps on their front or rear, e.g., metal deposition (sputtering), coating with photoresist (spin-coating), lithography (UV exposition), wet-chemical processes for structuring, dry-chemical processes (plasma method), layer depositions or also annealing steps (oven, hotplates). In the case of very thin wafers, handling involves a high risk of breaking. Breaking of a wafer in a semiconductor factory can mean a loss of several thousand euros. For preventing breakage, techniques have been introduced by which a stabilization substrate (=carrier-wafer, carrier substrate, carrier) can be connected to the thin wafer (temporary bonding, reversible adhesive technologies).

Adhesive-based carrier technologies are easy to handle but the polymers are frequently expensive, spin-coating methods have a high loss of material, large amounts of waste of solvent hazardous waste are accumulated and the adhesives frequently have a low temperature stability. Additionally, these adhesive-based technologies necessitate specific apparatuses and methods for bonding (vacuum bond chamber, temperature) wafer and carrier. Above that, stripping the polymers is frequently difficult and the substrates have to be elaborately disengaged and cleaned from the polymer residuals. In the last step of cleaning the process substrate, the above-mentioned stabilizing carrier substrate no longer exists, which is why the risk of breakage of the process substrate increases again.

A known alternative carrier technology uses electrostatic holding forces between a rigid carrier substrate with rechargeable electrode structures and the fragile wafer to be processed. By discharging the electrodes, wafer and carrier can be separated again. No polymers are used, there is no contamination with polymer residuals and the holding forces also act at high temperatures, e.g., at above 400° C.

U.S. Pat. No. 5,691,876 discloses a combination of the above-stated bonding technologies. An electrode is embedded between two or more layers of a polymer dielectric. This assembly is attached to the top of the wafer chuck. The polymer layers are thermoplastic and are melted onto the wafer chuck on the one hand and the wafer on the other hand by applying pressure and temperature. Thus, the assembly is firmly connected to the wafer chuck in a permanent manner and to the wafer in a temporary manner.

Apart from such electrostatic chucks that are firmly installed in process plants as massive blocks, mobile carriers are known as well. EP 1305 821 B1 discloses such a mobile carrier. This carrier is produced on rigid substrates. Here, producing the electrode structures can be performed relatively easy. However, it is very expensive to provide so-called E-carriers with rear contacts because, for example in the case of an Si substrate, the contact via through the wafer (TSV through silicon via) would need to have very good electric insulation. Above that, process steps for metal patterning have to be performed on both wafer sides.

SUMMARY

According to an embodiment, an apparatus for electrostatic coupling of a substrate with a substrate carrier may have: a flexible plastic carrier film on which an electrically contactable electrode structure is unilaterally deposited, and a cover layer which can be brought into contact with electrode structure on the side of the electrode structure facing away from the carrier film, wherein the apparatus is configured such that, in a coupled state, the same is arranged at least in sections between the substrate and the substrate carrier and, in a non-coupled state, the same can be removed from the substrate carrier in a reusable manner.

Another embodiment may have a substrate stack comprising a substrate, a substrate carrier and an inventive apparatus arranged between the substrate and the substrate carrier.

According to another embodiment, usage of an inventive apparatus may have the steps of: arranging the apparatus between the substrate and the substrate carrier, and applying a DC voltage between the electrode structure and the substrate and/or between the electrode structure and the substrate carrier, or applying a DC voltage between first and second electrode structures or between first and a second electrode areas when the apparatus comprises at least two electrode structures and/or at least two electrode areas.

The inventive apparatus forms a capacitor assembly between the electrode structure connected to the carrier film and the substrate (wafer) and the substrate carrier (wafer holder), respectively. After charging via a voltage source, the same can be disconnected and removed again, respectively. The capacity of the capacitor assembly of electrode structure and the substrate with conductive layer below or above the same maintains the charge state and, hence, the electrostatic holding force for a longer time period. Additionally, the electric field between the electrode areas also causes permanent polarization effects in the intermediate insulation layers, such as in the flexible plastic carrier film and/or the cover layer. Thus, a transportable moveable carrier system without any cable connections results. Additionally, the size and shape of the carrier film can be freely selected. For example, the production on large film sheets in multiple use or also in a continuous process (roller to roller method) is possible. Thereby, the production method becomes inexpensive. Above that, an electrostatic structure on films is cheaper to produce than the rigid E-carriers known so far which are produced based on semiconductor technological methods in a semiconductor line. Above that, carrier films can be easily replaced if damages have occurred which would affect the electrostatic functionality. In a coupled state, the carrier film is arranged at least in sections between the wafer and the wafer carrier. Here, the carrier film can be larger than the deposited wafer. Thus, during wafer processing, there is the advantage that an electrostatically activatable area can have the same size as or can even be greater than the wafer. Here, the holding force can act up to the outermost wafer edge. This is important if the wafer is slightly arched up at the edge due to internal tensions. Further, vertical vias through the electrically insulating film are easy to realize, for example by drilling a laser hole and metal sputtering. Here, no lateral electrical insulation of the via is necessitated. The inventive apparatus can apply holding forces "towards the top", i.e., on the wafer side, and "towards the bottom", i.e., on the carrier side. Providing a similar characteristic on a silicon wafer is only realizable with increased effort. Above that, the inventive apparatus can be simply used as "interposer" between a wafer having a smaller diameter and a carrier having a greater diameter. This is advantageous when, for example, 4" wafers are to be mounted in a reversible manner on 6" or 8" carriers. The inventive apparatus offers the advantage that wafer processing equipment whose handling technology is actually only configured for large substrates can also be used for smaller substrates or also for a plurality of smaller substrates. For example, several 2" SiC wafers can also be placed reversibly on an 8" carrier wafer with respectively configured electrode geometry by means of an inventive apparatus in order to be able to process the same in a conventional wafer processing plant.

The carrier film and the electrode structure deposited thereon can together have a thickness of less than 200 μm. In a further embodiment, the carrier film and the electrode structure deposited thereon can together have a thickness of less than 100 μm or even less than 70 μm. This low layer thickness allows simple handling and space-saving arrangement when the apparatus is disposed between wafer and wafer carrier.

The carrier film can include at least one of the plastics polyimide, polyether ether ketone (PEEK), polyethylene naphthalate (PEN), liquid crystalline LCP polymer or polyethylene terephthalate (PET). In other words, the film can consist or can be produced, respectively, of at least one of these plastics. Polyimide is particularly well suited as carrier film since this plastic has a temperature resistance of more than 350° C. up to approximately 400° C. In some steps of wafer processing where such high temperatures can occur, the inventive apparatus can hence be used without significant losses in function and/or structure. Above that, polyimide films in a thickness range of a few micrometers up to several hundred micrometers are easy to produce and easily available.

The electrode structure can comprise a metal, a conductive polymer, e.g., poly (3,4-ethylene dioxythiophene) (PEDOT or PEDT), a doped semiconductor layer, e.g., polysilicon or a transparent, anorganic conductor, such as indium tin oxide (ITO).

The metal of the electrode structure can be provided as coating or as film, in particular as stamped metal film. A metal coating is advantageously formed as thin coating produced by a sputtering method or also by vapor deposition. The coating can also be provided by depositing conductive ink or by depositing nanoparticles. Alternatively, the metal can also be configured as metal film, wherein stamped metal films are easy to produce and easily available.

It is possible that the apparatus comprises at least one further layer comprising metal, wherein the metal is provided as coating or as film. In that way, multiple capacitor structures can be provided. Additionally, such a laminar structure or composition can increase the stability of the apparatus. Above that, the thermal expansion of the apparatus is easy to control by suitable material selection, for example by selecting a metal having a similar temperature dependent coefficient of expansion as the material of the carrier film.

A suitable material for the metal provided in the electrode structure and/or in the further layer would, for example, be copper. In particular in connection with a polyimide carrier film, good controllability of the thermal expansion of the apparatus results, since copper and polyimide have a similar thermal expansion. Thus, tensions within the apparatus can be kept low. Further, in such a laminar structure, a symmetrical setup, in particular along an axis extending between the substrate and the substrate carrier is desirable, since this can mostly prevent warpage of the apparatus during heating.

The cover layer can be an insulting layer that is mounted on the electrode structure or on the side of the substrate facing the electrode structure. Alternatively, the insulating cover layer can also be mounted on the side of the substrate carrier facing the electrode structure. The insulating layer prevents direct contacting of the electrode structure with the substrate and the substrate carrier, respectively.

The cover layer can be configured as plastic film. Advantageously, this cover layer comprises the same material and/or approximately the same thickness as the plastic carrier film. By using the same film and the same material, respectively, the cost of the process for producing the inventive apparatus can be kept low. Additionally, with the same layer thickness, the charge can be easily and equally distributed within the apparatus.

The electrode structure can be divided into at least two electrically contactable electrode areas, wherein the electrode areas are arranged approximately in the same plane. In that way, a bipolar configuration can be provided. Here, the two electrode areas of the electrode structures are connected to one pole of the voltage source each. Since the two electrode structures lie within one plane, the parts of this plane existing and remaining, respectively, between the two electrode structures, can serve as dielectric in a simple manner.

One electrode structure of the apparatus can be arranged in a first plane, wherein the apparatus can further comprise at least one second electrically contactable electrode structure arranged in a second plane differing from the first plane. In that way, a unipolar configuration in several planes and with several layers, respectively, can be provided. For example, the apparatus can comprise at least two electrode structures lying above one another, each of which can be individually contacted. In that way, the first electrode structure can be used for fixing a deposited substrate (e.g., fragile wafer) and the second electrode structure can be used for activating a holding force on the carrier side to a metal plate or to a carrier having a conductive layer. Here, it is an advantage that, for example, at first, a wafer is placed and fixed on the apparatus, and then this substrate stack is moved into a process plant and there possibly deposited onto a wafer chuck. Then, in the process chamber, the carrier-side electrode structure is activated, whereupon the apparatus stack is firmly pressed onto the base. This is very important, e.g., for heating chucks, in order to ensure good thermal contact to the heating plate, in particular in a vacuum environment. A two-sheet and two-layer apparatus, respectively, can also be used well in the context of electrostatic wafer handlers. The same are advantageously used in vacuum chambers since here the usual vacuum clamping no longer works. In this case, the carrier-side electrode structure does not need any exposed contact pads. A bipolar wafer hander (at the robot arm) is sufficient to apply electrostatic force on the carrier-side electrode structure. At the same time, this carrier-side electrode structure at the bottom shields the electric fields from the electrode structures lying above, i.e., the same do not adversely affect each other.

The second electrode can be divided into at least two electrically contactable electrode areas, wherein the electrode areas are approximately arranged within the same plane. In that way, two planes and layers, respectively, can be provided where one electrode structure each exists. In that way, for example, a first electrode structure can be provided in a first plane, while a second electrode structure is arranged in a second plane. Additionally, both the first and the second electrode structures can be divided into two or more electrode areas. In that way, a multi-sheet and multi-layer bipolar electrode configuration, respectively, is provided. For example, two electrode structures, e.g., metal areas lying above one another and separated by an insulating layer are provided within the apparatus, wherein one or two metal layers are divided into two or more electrode areas. In that way, the holding forces can be individually switched on and off both on the substrate side and the carrier side, respectively. In contrast to the above-mentioned unipolar contacting, bipolar fixing has the general advantage that no further contacting and charging of the deposited substrate and the substrate carrier, respectively, is necessitated.

Additionally, mixed forms of unipolar and bipolar electrode structures are suggested for multi-sheet and multi-layer structures. For example, on the side of the apparatus facing the substrate, a bipolar electrode structure can be provided and on the side of the apparatus facing the substrate carrier, a unipolar electrode structure can be provided. The two electrode structures are vertically isolated from each other, i.e., along an axis extending between the substrate and the substrate carrier. A carrier-side unipolar electrode structure can be used as "counter-electrode" for a conventional electrostatic wafer chuck that is firmly installed in a plant. However, the carrier-side unipolar electrode structure can also be used as an activatable electrode having an individual contacting area for unipolar charging in the direction of the carrier. This arrangement of the apparatus can also be provided vice versa, wherein a unipolar electrode structure is provided on the substrate side and a bipolar electrode structure is provided on the carrier side.

In a multi-sheet and a multi-layer apparatuses, respectively, it can be advantageous that an insulating layer between the electrode structures has a greater thickness and a greater spacing, respectively, than the thickness of the carrier film and/or the thickness of the cover layer. Thereby, the main part of the electric fields, i.e., the main part of the activatable holding force will act towards the top and towards the bottom, i.e., in the direction of the deposited substrate and in the direction of the substrate carrier arranged below, respectively, instead of acting between the double-sheet electrode structures of the apparatus. The fields between the electrode structures of a multi-sheet and multi-layer apparatus, respectively, are not able to contribute to the holding force in the direction of the substrate and in the direction of the substrate carrier, respectively.

The electrode structure can comprise a contacting portion that projects at least in sections beyond the outer circumference of the substrate and/or the substrate carrier, such that the contacting portion is accessible from the outside when the apparatus is arranged between the substrate and the substrate carrier. Contacts of a voltage source, for example, can be attached to the contacting portion and connected to the apparatus, respectively, in order to charge the apparatus. Basically, these contacting portions can be designed very flexibly as regards to geometry, i.e., size, depth, width are freely selectable, wherein contact electrodes projecting laterally, i.e., beyond the outer circumference of the substrate and the substrate carrier, respectively, are easy to realize. Thus, the free design allows an implementation of contacting portions for charging that lies outside the actual holding areas. The contacting portions can project beyond the edge of process wafer or carrier at one or several locations, e.g., as "ears". These projecting contact areas allow very simple charging of the electrostatic structure. A further advantage results from the laterally projecting contacting portions in that the same allow, in contrast to conventional technology, easy recharging of the apparatus, even during processing. This is an improvement with respect to conventionally known mobile E-carrier systems. In the case of handling wafer substrates, it can additionally be advantageous to place the contacting portions at defined locations such that standard wafer racks and wafer cartridges can still be used.

Here, it is advantageous when the electrode structure comprises a contacting portion that is configured such that the electrode structure is electrically insulated towards the outside when the contacting portion is contacted. This offers advantages, e.g., in the above-mentioned recharging during processing. Recharging can take place, for example, in a plasma chamber, on a hot plate or in an oven. Recharging is in particular necessitated when the leakage currents occurring at high temperatures quickly reduce the charge state towards zero. For recharging during a process, the contacting portions have to be connected at least temporarily to a voltage source. This can, for example, take place by clamping contacts that, for example, completely cover the contacting portions and cover the same such that conductive connections to the environment are electrically insulated, respectively. This is important so that no leakage current or short-circuit can occur between the electrodes or between environmental medium and electrodes, even in a plasma chamber, where an electrically conductive ionized gas exists. The same applies for liquid environments, such as water, solvent or chemical baths.

The electrode structure can comprise a contacting portion, wherein the cover layer comprises a recess in the area of the contacting portion, such that the contacting portion can be contacted through the recess. This offers a simple option for charging the electrode structure since a pin or contact pin connected to a voltage source can be easily inserted through the recess provided in the cover layer in order to come into contact with the electrode structure.

Further, the apparatus can comprise a contact layer comprising a conductive or semiconductive material, which is arranged on the side of the cover layer facing away from the electrode structure and that covers that recess provided in the cover layer at least in sections, wherein the contact layer is arranged spaced apart from the electrode structure in the area of the recess. This offers the advantage that the electrode structure is not easily accessible from the outside and is hence arranged below the contact layer in a protected manner. Advantageously, the contact layer comprises a conductive or semi-conductive material on both sides.

The contact layer can be brought into contact with the electrode structure in the area of the recess when a force is applied to the contact layer and/or the electrode structure. For example, a pin or contact pin connected to a voltage source can be pressed onto the contact layer which then moves in the direction of the electrode structure. As soon as the contact layer comes into contact with the electrode structure, the electrode structure is charged. After removing the contact pin and the voltage source, respectively, the contact layer returns to its original starting position where the same is spaced apart from the electrode structure. Thus, the contact layer and the electrode structure are no longer in contact with one another. Thus, after removing the voltage source, charge applied previously to the electrode structure can no longer be discharged via the environment, e.g., air, water, plasma, etchant, solvents and the same. Above that, this offers additional protection against accidental discharge for the personnel handling the apparatus.

The contact layer can comprise a contact portion which is arranged spaced apart from the recess in radial direction and/or arranged along a circumference of the apparatus offset from the recess by an angle α. During handling, this offers additional protection against accidental discharge of the apparatus. This can be advantageous in that, for example, accidental discharge during "touching" the electrostatic apparatus is prevented. It is unlikely that a person when touching the apparatus presses the contact portion and at the same time the contact layer, such that discharge could occur.

Very thin semiconductor substrates having a thickness of e.g., below 100 µm have a sharp edge and also a very fragile wafer edge. For preventing breaking-off of the edge and involved particle generation, so-called edge-trim or edge-grinding processes are used. Here, the wafer diameter is reduced by approximately 0.5 to 5 mm by material removal at the wafer edge. It is an advantage that this also removes all thinning and fragile locations at the wafer edge. This is of particular interest in bonded wafer pairs, so-called wafer stacks. Wafers having a non-standardized diameter can also be handled with the traditional handling tools (wafer racks, etc.). Thus, it would be favorable to place a reversible carrier below these "smaller" wafers.

Thus, the substrate carrier can comprise a recess where the carrier film, the electrode structure, the cover layer and the substrate can be arranged at least in sections. In other words, the substrate carrier can comprise a recess in which, for example, a process wafer having a reduced diameter can be deposited in the internal region. By forming a recess, a laterally raised edge results. This raised edge of the substrate carrier offers additional protection from lateral shifting of the parts arranged within the recess. Here, the apparatus is placed between process wafer and carrier wafer into the recess and holds the substrate stack together after the same are electrostatically charged.

It is possible that a wall circumscribing laterally along the recess comprises a breakthrough that is configured to receive a contacting portion of the electrode structure such that the same extends beyond the circumference of the substrate carrier. The projecting contacting portions allow good contacting of the apparatus even when the apparatus itself is arranged in a deepened manner within a recess of the substrate carrier.

The apparatus can comprise a recess that extends completely through the apparatus. Such recesses and open areas, respectively, are also referred to as windows and can be easily introduced into the carrier film. In that way, apparatuses can be realized where a deposited substrate, e.g., also in the form of a film, can be processed from both sides, e.g., in a wet-chemical process. Here, the wet chemicals can be deposited onto the substrate from both the top and the bottom, wherein in the latter case the chemicals reach the substrate through the recess (window) provided in the apparatus. Accordingly, it can be advantageous in that case to provide the apparatus with a recess, i.e., as some sort of frame structure comprising open areas. Here, the electrostatic holding force is applied via the remaining electrode structures in the resulting frames and ridges, respectively.

It is further suggested to provide a substrate stack, wherein the substrate stack comprises a substrate, a substrate carrier and an apparatus according to one of the preceding features arranged between the substrate and the substrate carrier. Such a substrate stack comprises at least the above mentioned advantages that can be obtained with the inventive apparatus.

A further aspect of the invention relates to the usage of an apparatus according to one of the above features. The usage includes arranging the apparatus between the substrate and the substrate carrier and at least temporarily applying a DC voltage between the electrode structure and the substrate and/or between the electrode structure and the substrate carrier. Here, the usage of a unipolar structure having the above mentioned advantages is named.

Alternatively, the usage includes arranging the apparatus between the substrate and the substrate carrier and at least temporarily applying a DC voltage between first and second electrode structures or between first and second electrode areas when the apparatus comprises at least two electrode structures and/or at least one electrode structure having two electrode areas. Here, the usage of a bipolar structure having the above mentioned advantages is stated.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
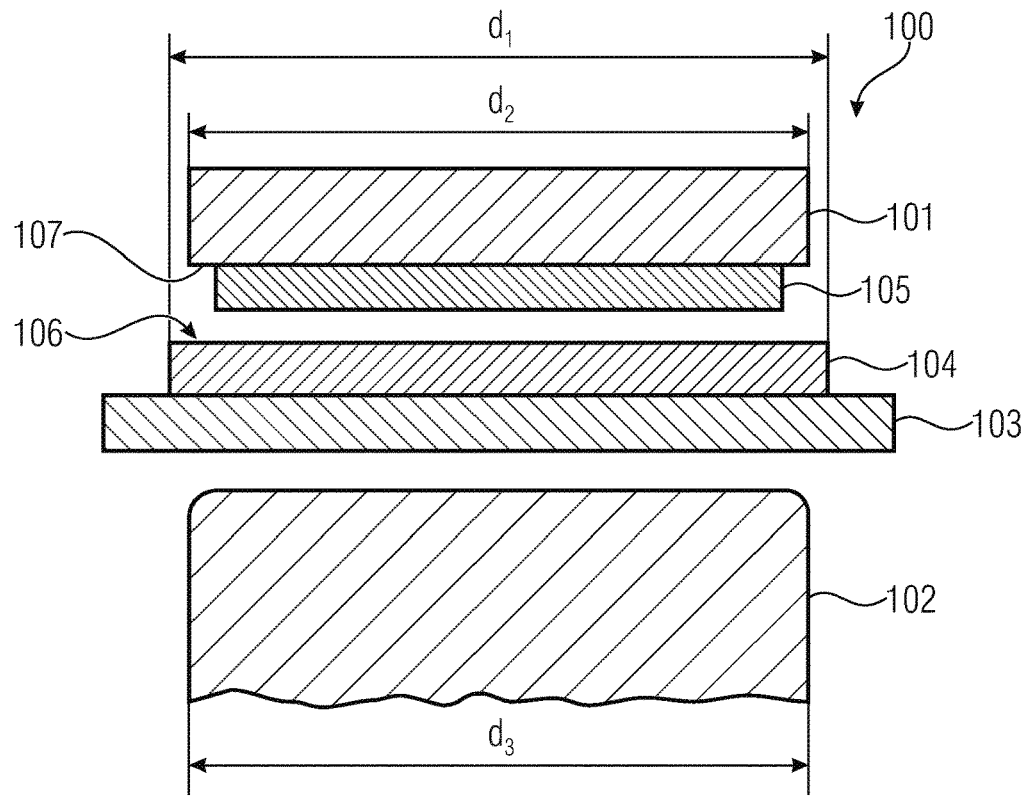
FIG. 1A is a lateral sectional view of an inventive apparatus according to an embodiment.

FIG. 1A shows a lateral sectional view of an inventive apparatus 100 for electrostatic coupling of a substrate 100 to a substrate carrier 102. The apparatus 100 comprises a flexible plastic carrier film 103. An electrode structure 104 is unilaterally disposed on the carrier film 103.

On the side 106 of the electrode structure 104 facing away from the carrier film 103, the apparatus 100 comprises a cover layer 105. The cover layer 105 can be brought into contact with the electrode structure 104. The cover layer 105 is provided between the electrode structure 104 and the substrate 101. As shown in FIG. 1A, the cover layer 105 can be coupled to the side 107 of the substrate 101 facing the substrate carrier 102.

The inventive apparatus 100 is configured such that the same is arranged, in an electrostatically coupled state, between substrate 101 and the substrate carrier 102 at least in sections. In a non-coupled state, the inventive apparatus 100 can be removed from the substrate carrier 102 in a reusable manner.

The electrode structure 104 comprises a diameter $d_1$, the substrate 101 comprises a diameter $d_2$ and the substrate carrier 102 comprises a diameter $d_3$. For enabling good electrostatic coupling between substrate 101 and the substrate carrier 102, the diameter $d_1$ of the electrode structure 104 is greater than the diameter $d_2$ of the substrate. Advantageously, the diameter $d_1$ of the electrode structure 104 can also be greater than the diameter $d_3$ of the substrate carrier 102.

Figure 1B:
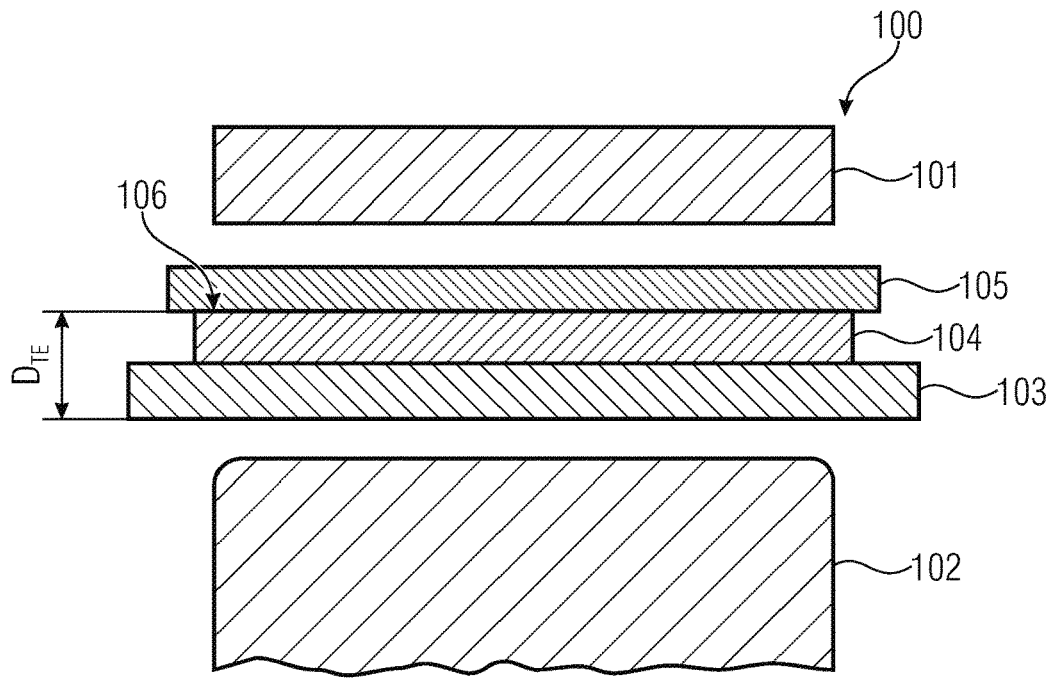
FIG. 1B is a lateral sectional view of an inventive apparatus according to a further embodiment.

FIG. 1B shows a lateral sectional view of a further embodiment of the inventive apparatus 100. The difference to the embodiment shown in FIG. 1A is, among others, that the diameter $d_1$ of the electrode structure 104 is smaller than the diameter $d_2$ of the substrate and also the diameter $d_3$ of the substrate carrier 102, respectively. Further, the embodiment shown in FIG. 1B differs from the embodiment shown in FIG. 1A in that the cover layer 105 is coupled to the side 106 of the electrode structure 104 facing away from the carrier film 103.

Thus, the apparatus 100 forms some sort of layer structure or layer stack comprising the carrier film 103, the cover layer 105 and the electrode structure 104 arranged in between. As illustrated in FIG. 1B, the carrier film 103 comes into contact with the substrate carrier 102 and the cover layer 105 comes into contact with the substrate 101. The layer stack 103, 104, 105 can be positioned between substrate 101 and substrate carrier 102 also in a reverse manner, such that the flexible plastic carrier film 103 comes into contact with the substrate 101 and the cover layer 105 with the substrate carrier 102.

The plastic carrier film 103 is a flexible plastic film serving as carrier and substrate, respectively, for the electrode structure 104. The plastic film 103 is flexible, i.e., the same is elastically deformable without much force.

The carrier film 103 comprises, together with the electrode structure 104 deposited thereon, a thickness $D_{TE}$ of less than 200 μm. In an alternative embodiment, the carrier film 103 comprises, together with the electrode structure 104 deposited thereon, a thickness $D_{TE}$ of less than 100 μm or of even less than 70 μm.

The carrier film 103 is a polyimide film, i.e., the same has a percentage of polyimide of more than 50%. The carrier film 103 can, however, also comprise percentages of more than 50% of polyether ether ketone, polyethylene naphthalate or also liquid crystalline LCP polymer.

In the embodiment shown in FIG. 1B, the electrode structure 104 is configured as stamped metal film. The metal film 104 has a percentage of more than 50% copper. The cover layer 105 is a plastic film having insulating features. Advantageously, the cover layer 105 is produced of the same material as the carrier film 103. Above that, the cover layer 105 can have approximately the same thickness as the plastic carrier film 103.

For electrostatic coupling of the substrate 101 to the substrate carrier 102, an electric potential is generated between the apparatus 100 and the substrate 101 and the substrate carrier 102, respectively.

Figure 8A:
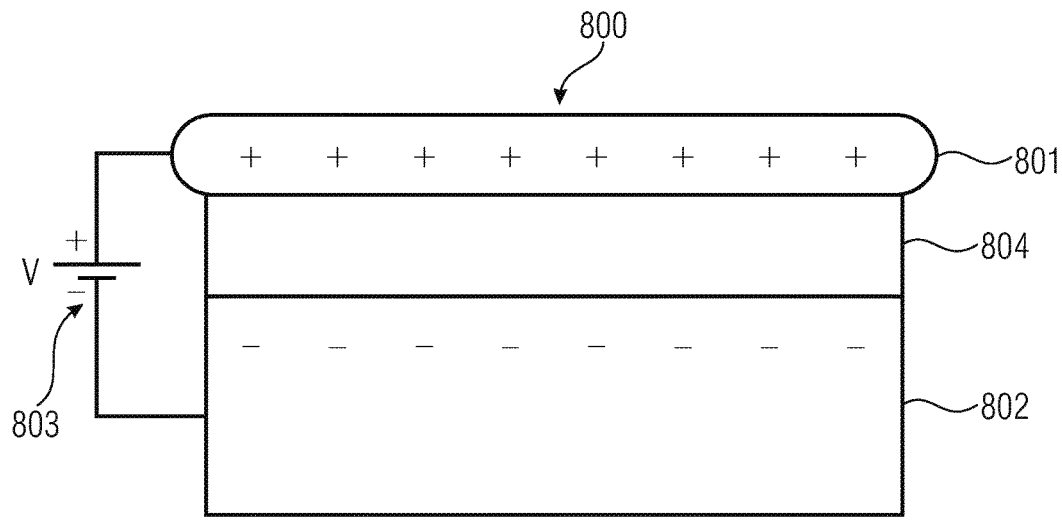
FIG. 8A is a diagram for illustrating the principle of unipolar coupling according to conventional technology.
Figure 8B:
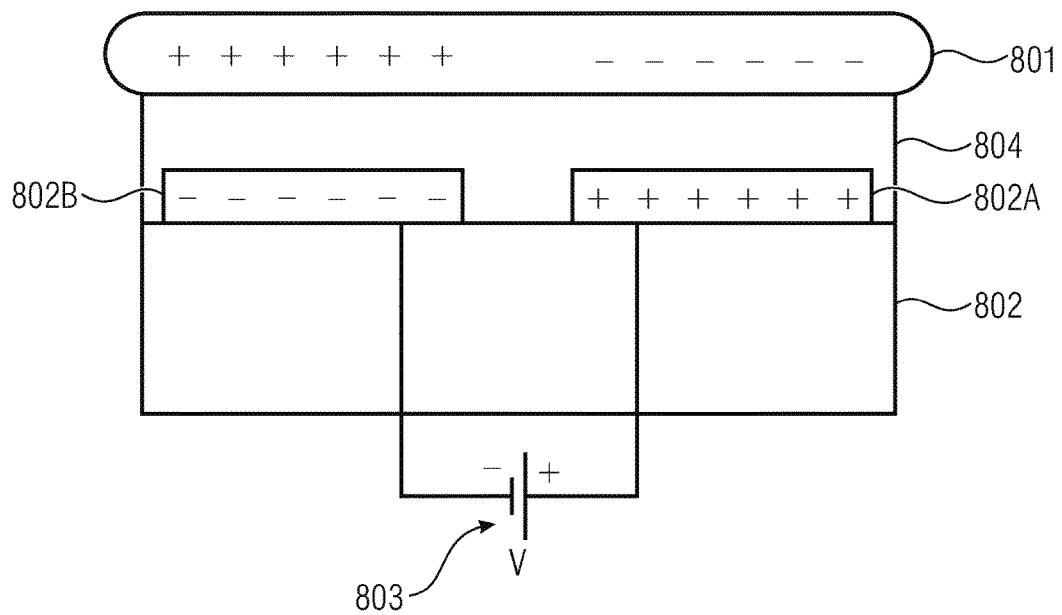
FIG. 8B is a diagram for illustrating the principle of bipolar coupling according to conventional technology.

For generating electrostatic holding forces, unipolar and bipolar electrode geometries are known. For illustration purposes, FIG. 8A shows a concept of unipolar fixing known from conventional technology. An apparatus 800 comprises a substrate 801 and a substrate carrier 102. A dielectric 804, which can also be air, is present between the substrate 801 and the substrate carrier 802. A DC voltage source 103 is connected temporarily and preliminarily, respectively, to the apparatus 100, for example for charging or discharging the shown capacitor assembly, wherein one of the two poles of the voltage source 103 is connected to the substrate 801 and the other one of the two poles of the voltage source 103 is connected to the substrate carrier 802.

For explanation purposes, 8B shows a concept of bipolar fixing known from conventional technology. Here, the substrate carrier 802 comprises two contactable areas 802A, 802B. A DC voltage source 103 is connected to the apparatus 100 temporarily and preliminarily, respectively, wherein one of the two poles of the voltage source 803 is connected to the first contactable area 802A and the other one of the two poles of the voltage source 803 is connected to the second contactable area 802B.

Figure 2A:
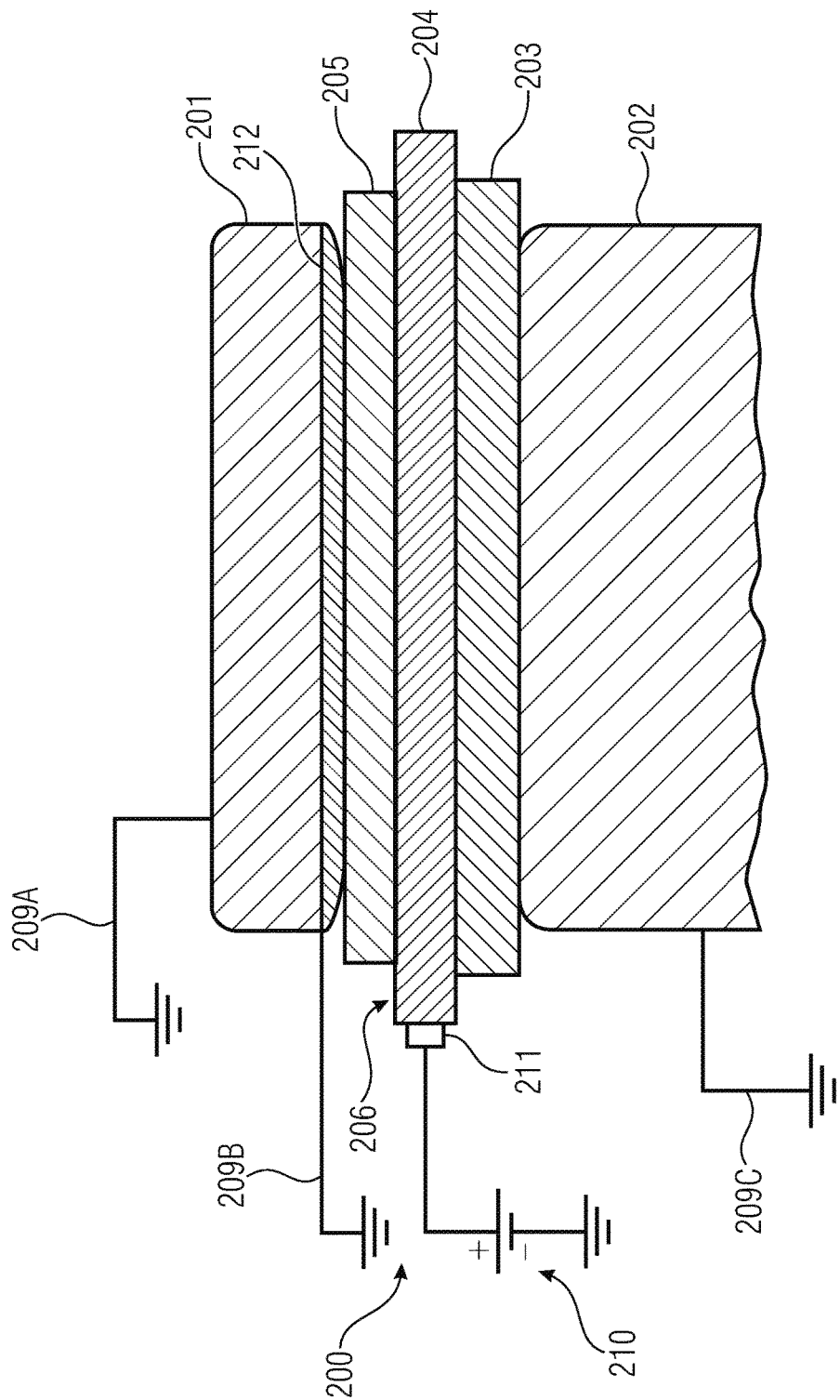
FIG. 2A is a lateral sectional view of an inventive apparatus according to an embodiment with unipolar configuration.

FIG. 2A shows an embodiment of an inventive apparatus 200 providing electrostatic coupling according to the principle of unipolar coupling. The apparatus 200 comprises a flexible plastic carrier film 203, a cover layer 205 and an electrode structure 204 disposed there between. The apparatus 200 is in a coupled state, i.e., the apparatus 200 couples the substrate 201 and the substrate carrier 202 electrostatically. In other words, the substrate 201 is electrostatically coupled to the substrate carrier 202 via the apparatus 200.

For this, a DC voltage source 210 is provided, wherein one of the two poles of the voltage source 210 is in contact with a contacting portion 211 of the electrode structure 204 temporarily and preliminarily, respectively. The substrate 201 or the substrate carrier 202 is connected to the respective other of the two poles of the voltage source 210 temporarily and preliminarily, respectively. In the shown embodiment, the electrode structure 204 is connected to the plus pole, and the substrate 201 as well as the substrate carrier 202 are each connected to ground and connected to the minus pole 209 of the voltage source 210, respectively.

In the embodiment shown in FIG. 2A, the electrode structure 204 consists of a metal layer that is unilaterally deposited on the carrier film 203, such as a polyimide film. The cover layer 205 has insulating characteristics. The cover layer 205 can be an adhered polymer film advantageously having the same material and/or the same thickness as the carrier film 203. Contact pads 211 for charging remain contactable on a small area. In the case of only one electrode structure 204 on the apparatus 200, a DC voltage 210 is applied between the electrode structure 204 and the deposited substrate 201 for unipolar fixing of the film stack 203, 204, 205 at least temporarily and preliminarily, respectively.

In the example shown in FIG. 2A, the electrode structure 204 is connected to the plus pole of the voltage source 210 and the substrate 201 is connected to the minus pole 209A of the voltage source 210 and connected to ground, respectively. This arrangement is advantageous when the substrate 201 consists of a conductive or semiconductive material, such as silicon.

If the substrate 201 consists of a non-conductive and insulating material, such as glass, the deposited substrate 201 can comprise a conductive or semiconductive layer 212 serving as opposite pole to the electrode structure 204 in the apparatus 200. In this example, the electrode structure 204 would be connected to the plus pole of the voltage source 210, and the conductive or semiconductive layer 212 of the substrate 201 would be connected to the minus pole 209B of the voltage source 210 and connected to ground, respectively, as shown in FIG. 2A.

Above that, a potential can be applied between the electrode structure 204 of the apparatus 200 and a plate 202 lying below (substrate carrier). This plate 202 can be a mobile carrier or a firmly installed wafer holding device (chuck, platform) or a hot plate or a silicon wafer or also a wafer of glass or ceramics with conductive coating.

Figure 2B:
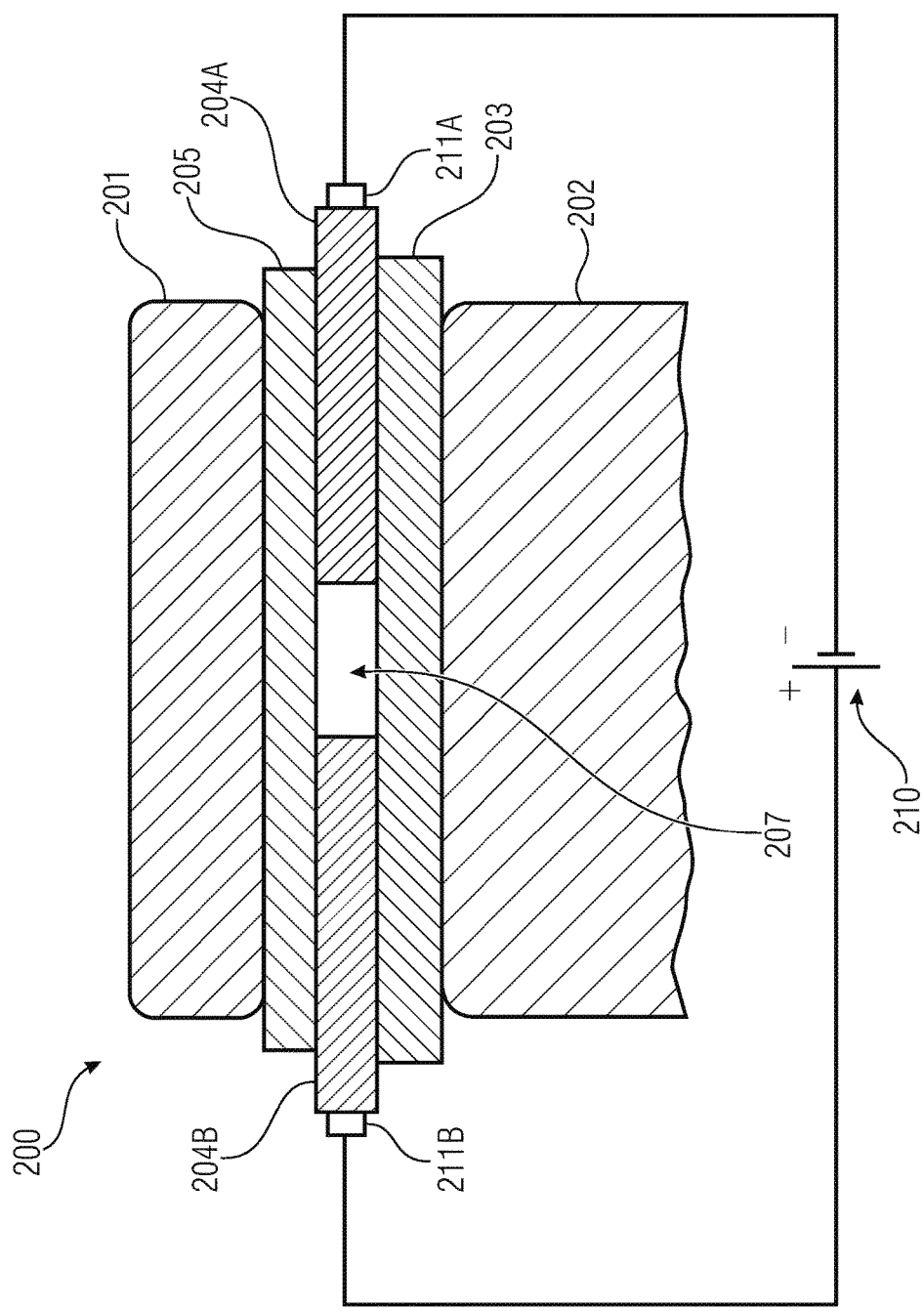
FIG. 2B is a lateral sectional view of an inventive apparatus according to an embodiment with bipolar configuration.

FIG. 2B shows an embodiment of an inventive apparatus 200 providing electrostatic coupling according to the principle of bipolar coupling. In contrary to the apparatus 200 shown in FIG. 2A, the apparatus 200 shown in FIG. 2B comprises two independently contactable electrode structures 204A, 204B. The two electrode structures 204A, 204B are spatially separated, e.g., by a gap 207 and electrically insulated. An insulating medium, such as air, ceramics, plastic or the same can be provided in the gap 207.

A first electrode structure 204A comprises a first contacting portion 211A. One of the two poles of a voltage source 210 is connected to the first electrode structure 204A via the contacting portion 211A.

A second electrode structure 204B comprises a second contacting portion 211B. The other one of the two poles of the voltage source 210 is connected to the second electrode structure 204B via the contacting portion 211B.

In an alternative implementation, instead of two electrode structures 204A, 204B, merely one electrode structure 204 could be provided which is again divided into two electrode areas 204A, 204B. The apparatus shown in FIG. 2B comprises, for example, a first electrode area 204A and a second electrode area 204B, wherein the two electrode areas 204A, 204B could also overlap. Such a division of an electrode structure 204 into several electrode areas 204A, 204B will be discussed below with reference to FIG. 3.

Within the layer stack 203, 204, 205, the two electrode structures and the two electrode areas 204A, 204B are arranged within the same plane, i.e., they are both within the plane between the carrier film 203 and the cover layer 205.

Figure 2C:
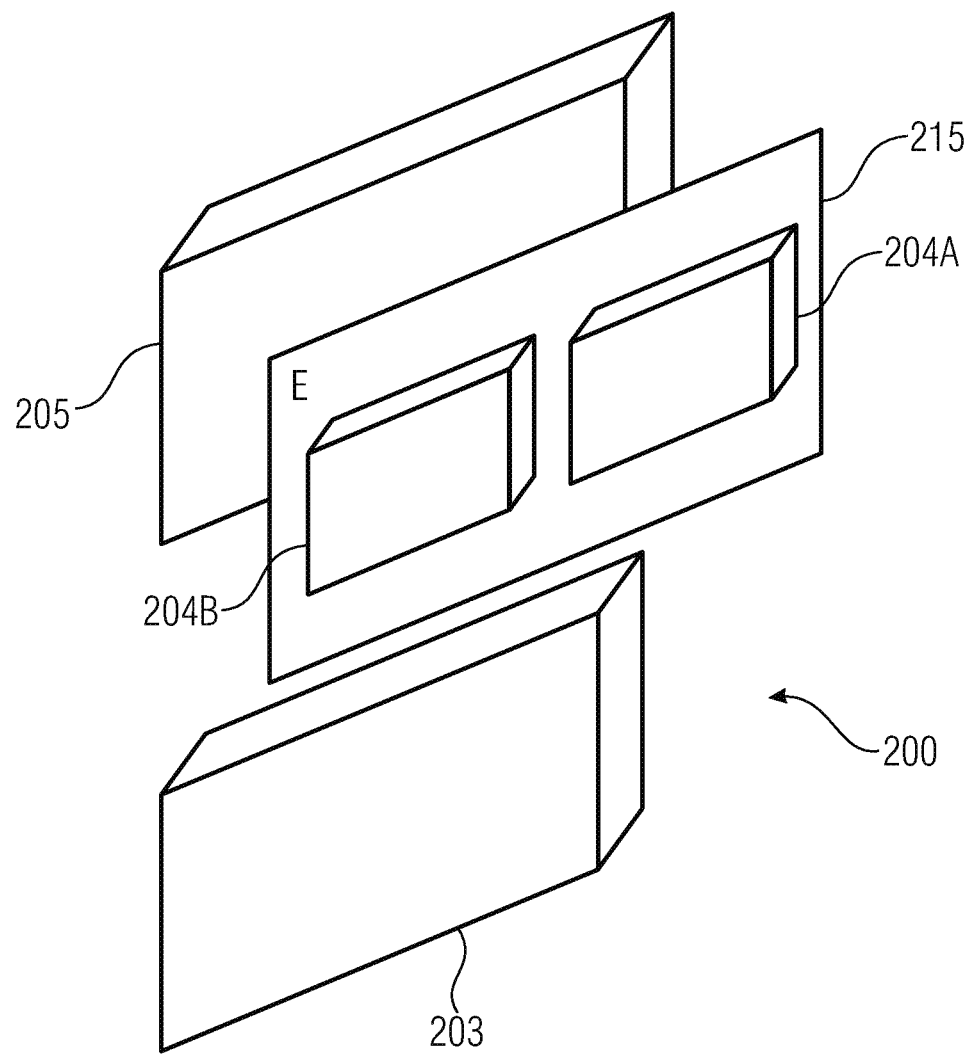
FIG. 2C is a perspective view of an inventive apparatus with an electrode structure within one plane.

This is illustrated in more detail in the perspective view shown in FIG. 2C. A plane 215 is spanned between the carrier film 203 and the cover layer 205. The two electrode structures and electrode areas 204A, 204B, respectively, are arranged within this plane 215.

Figure 2D:
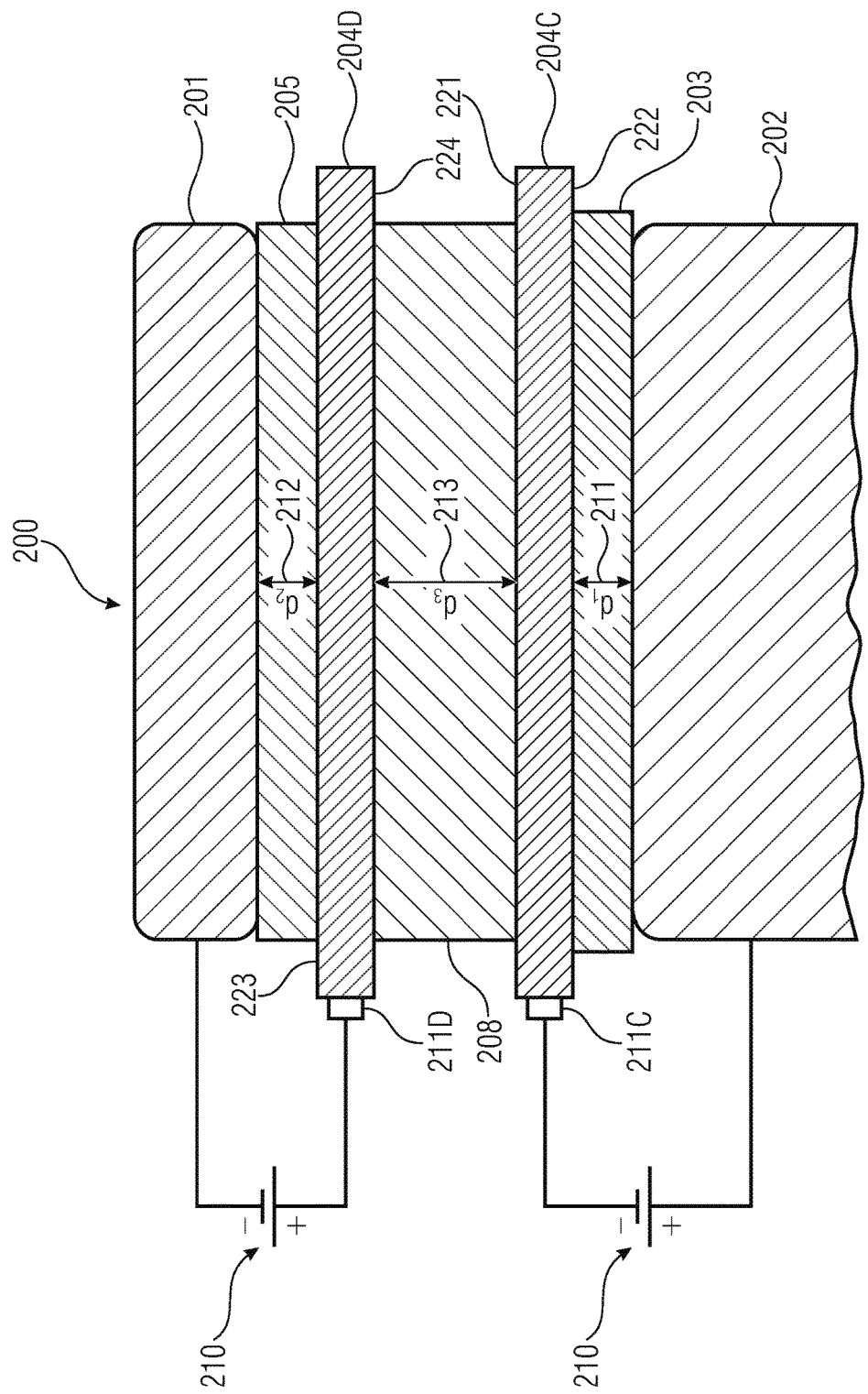
FIG. 2D is a lateral sectional view of an inventive apparatus according to an embodiment with multi-layer unipolar configuration.

FIG. 2D shows a multi-layer unipolar structure of the inventive apparatus 200. The apparatus 200 comprises two electrode structures 204C, 204D disposed on top of one another. Accordingly, the two electrode structures 204C, 204D are arranged in two different planes. An insulation layer 208 is arranged between the two electrode structures 204C, 204D.

The first electrode structure 204C comes into contact with the insulation layer 208 with a side 221 facing the substrate 201. The first electrode structure 204C comes into contact with the plastic carrier film 203 with a side 222 facing the substrate carrier 202.

The second electrode structure 204D comes into contact with the cover layer 205 with a side 223 facing the substrate 201. The second electrode structure 204D comes into contact with the insulation layer 208 with a side 224 facing the substrate carrier 202.

Accordingly, the first electrode structure 204C is arranged in a first plane, i.e., between the insulation layer 201 and the carrier film 203, while the second electrode structure 204D is arranged in a second plane, i.e., between the insulation layer 208 and the cover layer 205.

The first electrode 204C comprises a first contacting portion 211C via which a pole of a voltage source 210 can be connected to the first electrode structure 204C.

The second electrode structure 204D comprises a second contacting portion 211D, via which a pole of a voltage source 210 can be connected to the second electrode structure 204D.

According to the embodiment shown in FIG. 2D, the carrier film 203 comprises a thickness $d_1$. The cover layer 205 comprises a thickness $d_2$. The insulation layer 208 comprises a thickness $d_3$. The thickness $d_3$ of the insulation layer 208 is greater than the thickness $d_2$ of the cover layer 205 and the thickness $d_1$ of the carrier film 203, respectively. Advantageously, the thickness $d_3$ of the insulation layer 208 is greater than the thickness $d_1$ of the carrier film 203 and the thickness $d_2$ of the cover layer 205 together. Thus, the electrostatic holding force acts mainly on the substrate carrier 202 and the substrate 201, while the thicker insulation layer 208 mostly prevents attraction of the two electrode structures 204C, 204D to one another. In other words, the electrostatic holding force between the electrode structures 204C, 204D and the substrate 201 and the substrate carrier 202, respectively, is greater than an electrostatic holding force between the two electrode structures 204C, 204D.

Figure 2E:
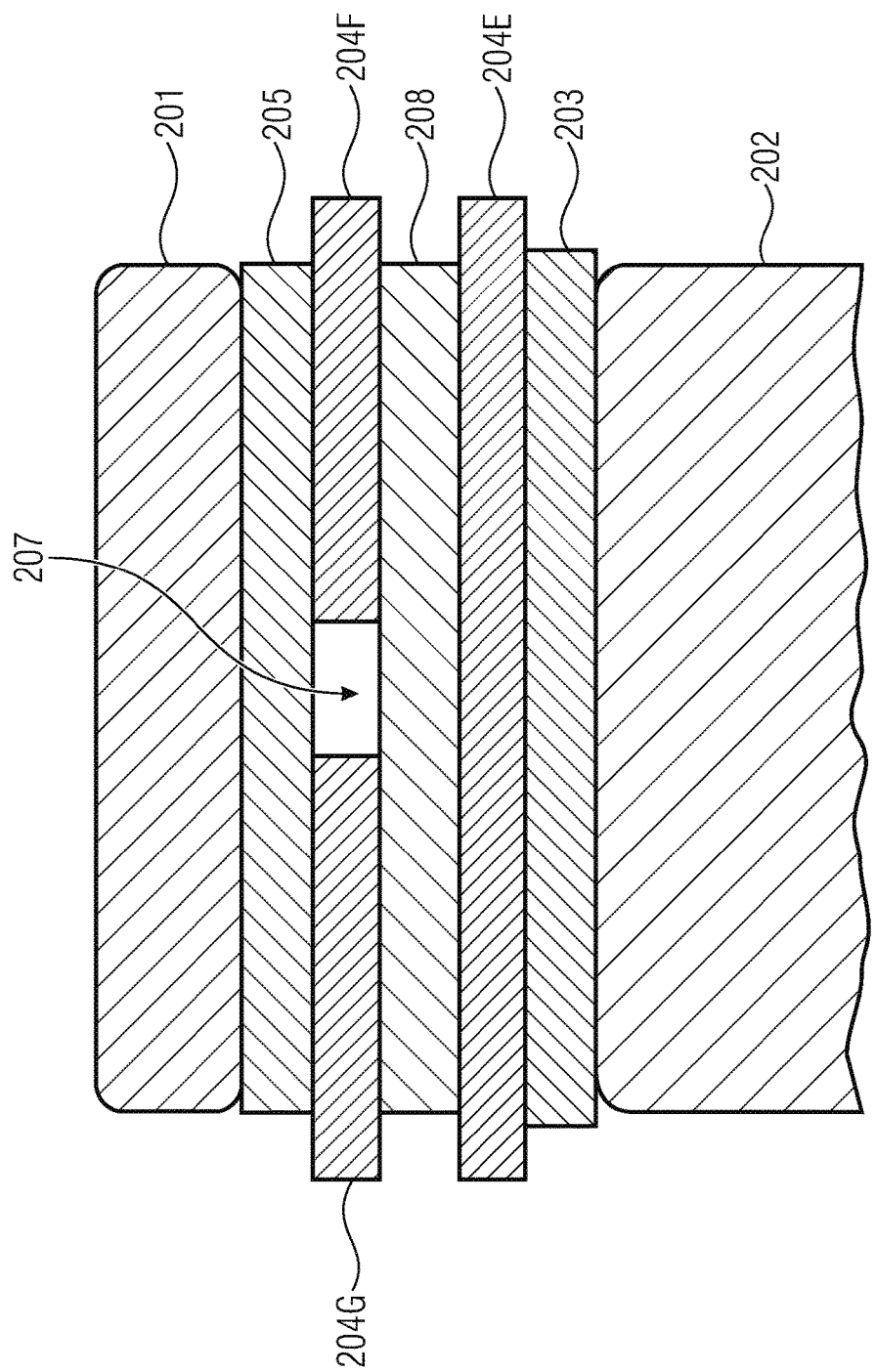
FIG. 2E is a lateral sectional view of an inventive apparatus according to an embodiment with multi-layer unipolar and bipolar configuration.

FIG. 2E shows an embodiment of an inventive apparatus 200 having a layer stack 203, 204E, 208, 204F, 205 comprising a unipolar electrode structure 204E and a bipolar electrode structure having a first electrode area 204F and a second electrode area 204G.

An insulation layer 208 is arranged between the unipolar electrode structure 204E and the bipolar electrode structure 204F, 204G. The two electrode areas 204F, 204G are separated from one another via an insulating gap 207 and electrically insulated from each other. Instead of the two electrode areas 204F, 204G, two separately contactable electrode structures can be provided between cover layer 205 and insulation layer 208.

In the embodiment shown in FIG. 2E, the two electrode areas 204F, 204G of the bipolar electrode structure are arranged between the cover layer 205 and the insulation layer 208.

The unipolar electrode structure 204E is arranged between the insulation layer 208 and the carrier film 203. It also possible that the unipolar electrode structure 204E is arranged between the insulation layer 208 and the cover layer 205 and that the bipolar electrode structure 204F, 204G is arranged between the insulation layer 208 and the carrier film 203. It would also be possible that the cover layer 205 comes into contact with the substrate carrier 202 and that the carrier film 203 comes into contact with the substrate 201.

As already mentioned with reference to FIG. 2D, it is useful when the thickness $d_3$ of the insulation layer 208 is greater than the thickness $d_1$ of the carrier film 203 and/or the thickness $d_2$ of the cover layer 205.

Figure 2F:
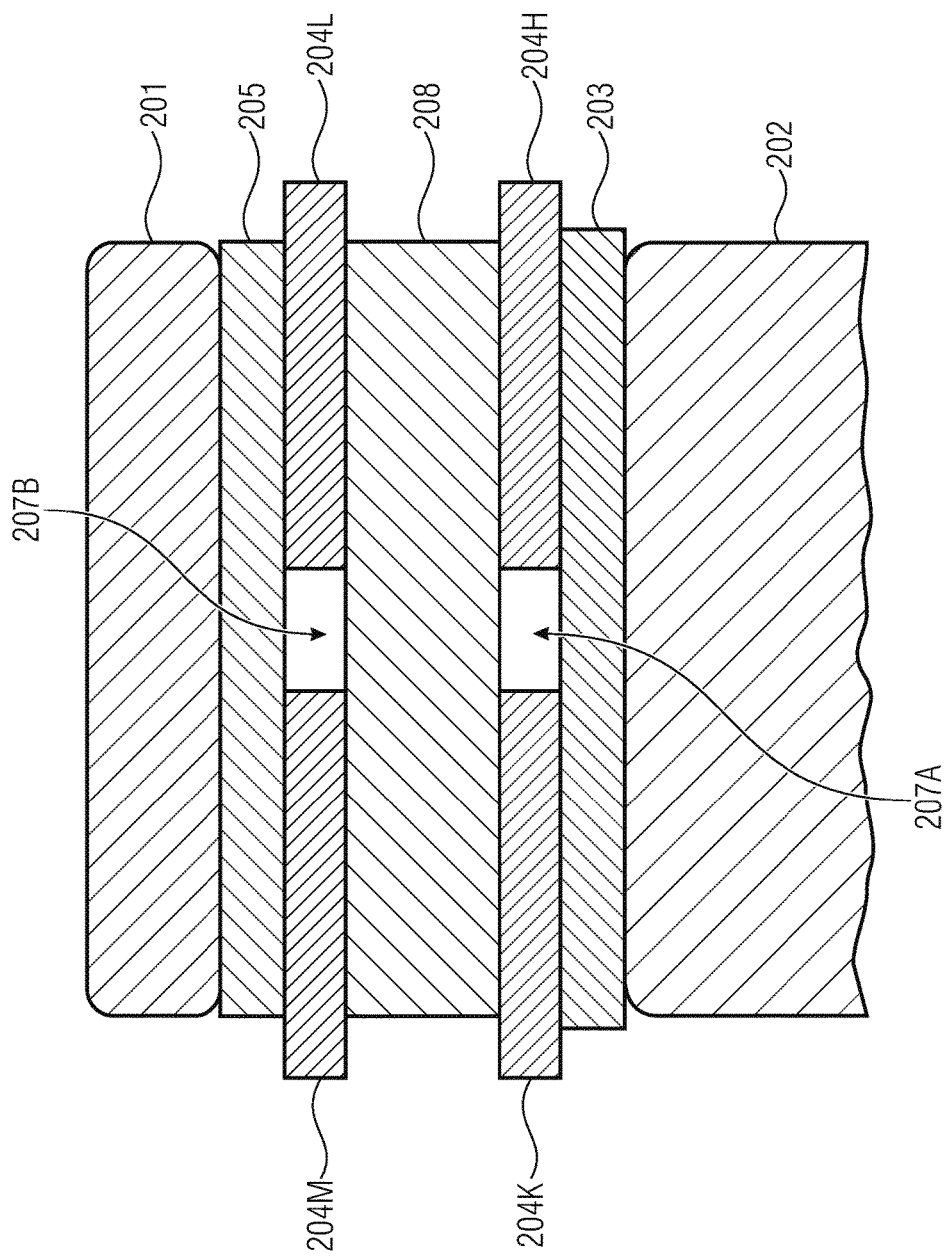
FIG. 2F is a lateral sectional view of an inventive apparatus according to an embodiment with multi-layer bipolar configuration.

FIG. 2F shows a further embodiment of the inventive apparatus 200 having a layer stack 203, 204H, 204K, 208, 204L, 204M, 205 with a first bipolar electrode structure 204H, 204K and second bipolar electrode structure 204L, 204M.

The first bipolar electrode structure comprises a first electrode area 204H and a second electrode area 204K, wherein both electrode areas 204H, 204K are separated from one another by an insulating gap 207A. The first bipolar electrode structure 204H, 204K is arranged between the insulation layer 208 and the carrier film 203, i.e., in a first plane.

The second bipolar electrode structure comprises a first electrode area 204L and a second electrode area 204M, wherein both electrode areas 204L, 204M are separated from one another by an insulating gap 207B. The second bipolar electrode structure 204L, 204M is arranged between the insulation layer 208 and the cover layer 205, i.e. in a second plane.

Figure 3:
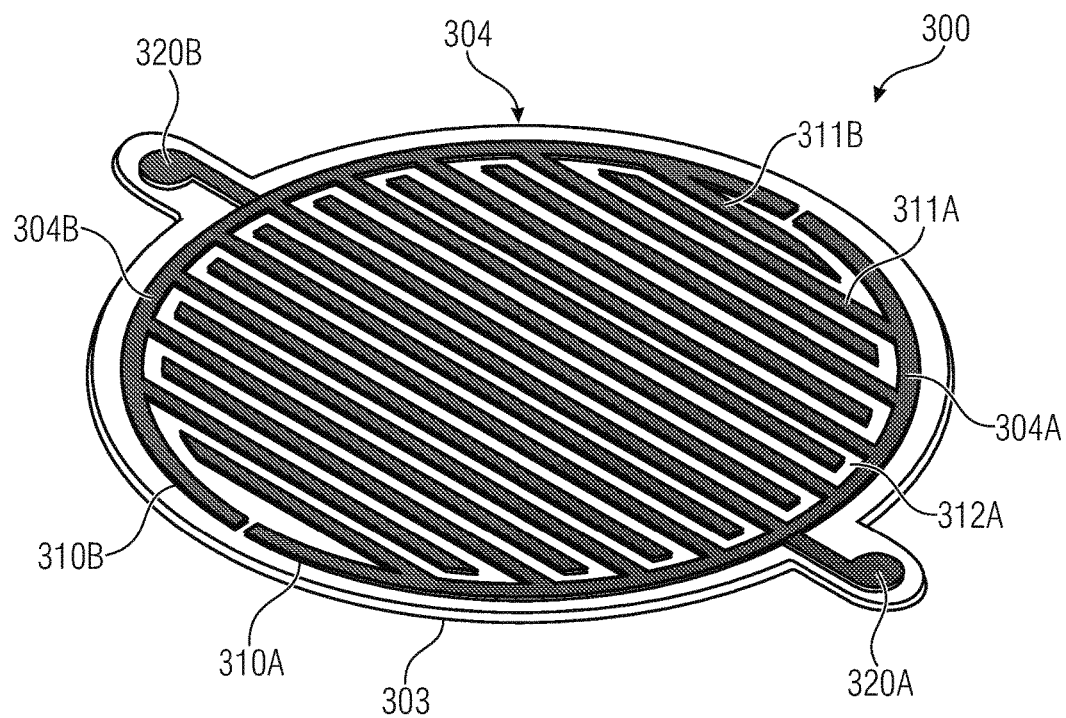
FIG. 3 is a perspective view of an inventive apparatus according to a further embodiment.

FIG. 3 shows a perspective view of an embodiment of an inventive apparatus 300 in a round format. The apparatus 300 comprises a flexible plastic carrier film 303. An electrode structure 304 is arranged on the carrier film 303.

The electrode structure 304 is divided in a first electrode area 304A and a second electrode area 304B. The electrode areas 304A, 304B are provided in the form of a stamped metal film. It is also possible that the electrode areas 304A, 304B are provided for example by etching technology or by sputtering or by deposition as metallic thin film.

The first electrode area 304A comprises a semicircular segmented edge portion 310A. The first edge portion 310A is arranged along a first half of the outer circumference of the carrier film 303. Several parallel ridges 311A extend along the first edge portion 310A in the direction of a second edge portion 310B arranged opposite on the circumference. A space 312A is formed between the ridges 311A.

Ridges 311B of the second electrode area 304B extend into the space 312A. The second electrode area 304B comprises a second semicircular segmented edge portion 310B. The second edge portion 310B is arranged along the second half of the outer circumference of the carrier film 303. Several parallel ridges 311B extend along the second edge portion 310B in the direction of the first edge portion 310A arranged opposite on the circumference. A space 312B is formed between the ridges 311B into which again the above-mentioned ridges 311A of the first edge portion 310A extend.

The area between the ridges 311A, 311B has insulating characteristics, such that the conductive ridges 311A, 311B are electrically insulated from one another.

The apparatus 300 comprises a first contacting portion 320A and a second contacting portion 320B. The two contacting portions 320A, 320B are configured to be brought into contact with a voltage source.

Figure 4:
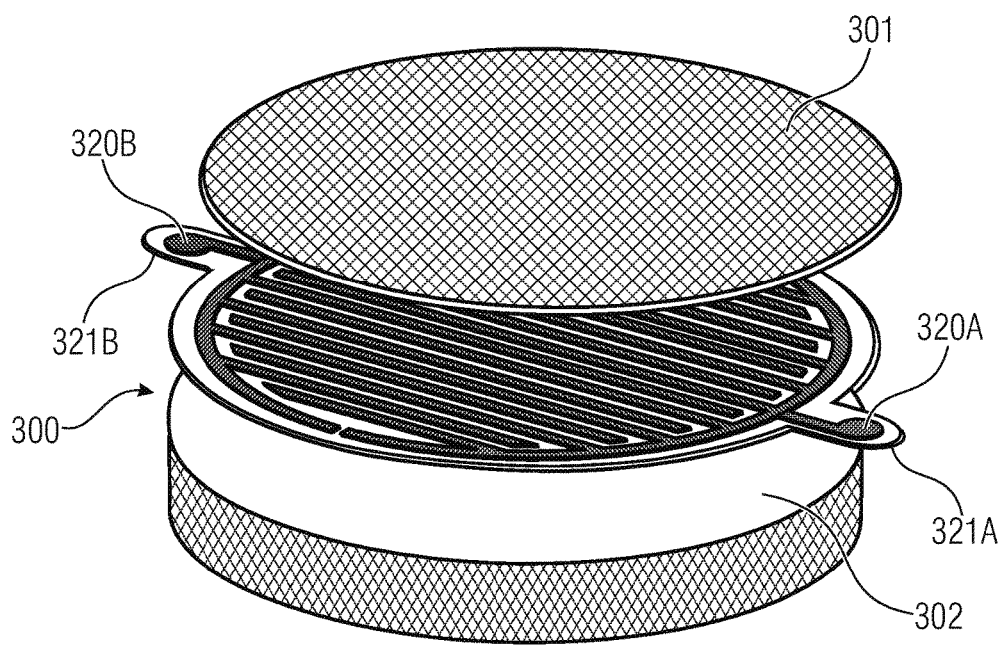
FIG. 4 is a perspective view of an inventive apparatus according to a further embodiment arranged between a substrate and a substrate carrier.

FIG. 4 shows the apparatus 300 arranged between a substrate 301 and a substrate carrier 302. Additionally, it can be seen that the two contacting portions 320A, 320B project at least in sections beyond the outer circumference of the substrate 301 and the substrate carrier 302. In that way, even in a coupled state where the apparatus 300 lies between the substrate 301 and the substrate carrier 302, the apparatus 300 can be contacted via the contacting portions 320A, 320B, since the same are still accessible from outside in the coupled state.

Advantageously, the contacting portions 320A, 320B are configured such that the electrode structure 304 is electrically insulated to the outside when the contacting portions 320A, 320B are contacted. For example, the carrier film 303 can have contacting areas 321A, 321B on which the contacting portions 320A, 320B of the electrode structure 304 are deposited. In the embodiments shown in FIGS. 3 and 4, the contacting areas 321A, 321B have the shape of "ears" that project beyond the lateral outer circumference of the carrier film 303. The contacting areas 321A, 321B of the carrier film 303 and the contacting portions 320A, 320B of the electrode structure 304 are also referred to as external contacts.

The ear-shaped contacting areas 321A, 321B and the external contacts, respectively, can be connected, for example with clamping contacts of a voltage source. Here, the clamping contacts can advantageously be mounted on the ear-shaped contacting areas 321A, 321B such that the contacting portions 320A, 320B of the electrode structure 304 are electrically insulated to the outside.

In the case of a unipolar electrode structure 304, it is sufficient to provide one contacting portion 320, while two contacting portions are advantageous in a bipolar electrode structure 304.

Embodiments of the external contacts, for example embodiments of the contacting portions 320A, 320B of the electrode structure 304 as well as the contacting areas 321A, 321B of the carrier film 303 will be discussed in more detail below with reference to FIGS. 7A to 7D.

Figure 5:
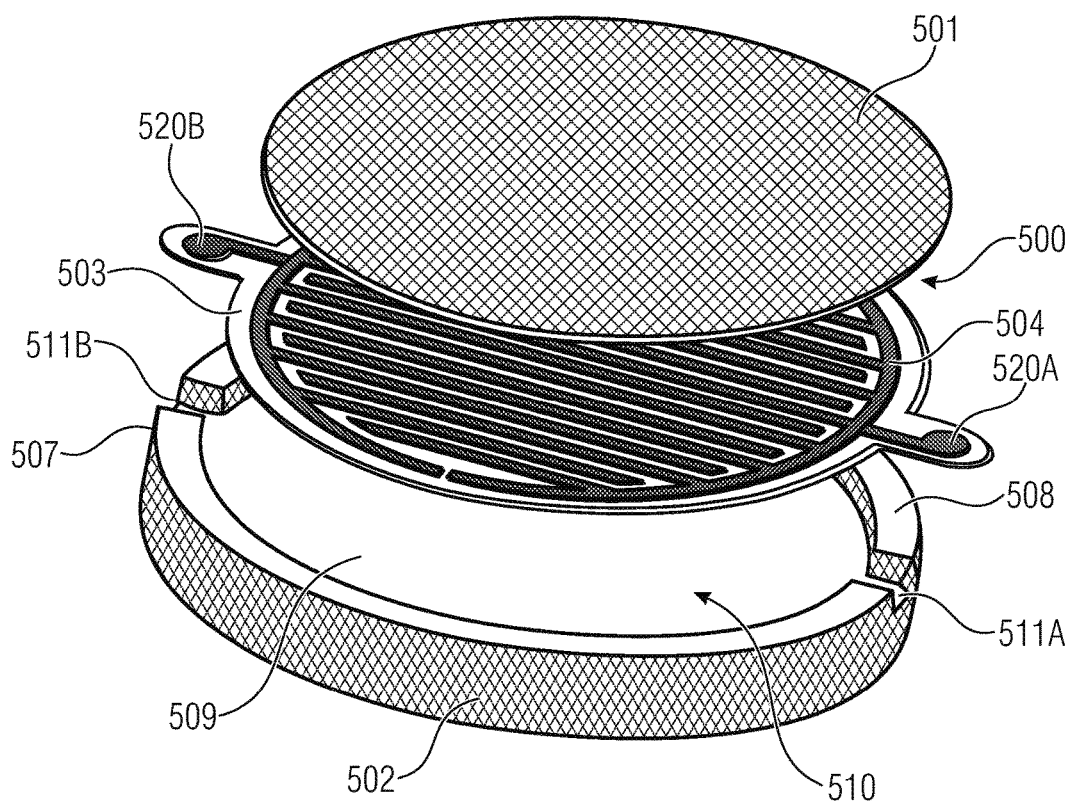
FIG. 5 is a perspective view of an inventive apparatus according to a further embodiment arranged between a substrate and a substrate carrier provided with a recess.

First, FIG. 5 shows a further embodiment of an inventive apparatus 500. The apparatus 500 comprises a flexible plastic carrier film 503. An electrode structure 504 is arranged on the carrier film 503. The apparatus 500 is arranged between a substrate 501 and a substrate carrier 502.

The substrate carrier 502 comprises a recess 510. The recess 510 is provided as a material recess, i.e. the inner area of the side 509 of the substrate carrier 502 facing the substrate 501 had been recessed. In that way, a circumferential wall 508 results, the top edge 507 of which is higher than the rest of the recessed area of the recess 510.

The apparatus 500 can be arranged within this recess 510. More precisely, depending on the depth of the recess 510, the carrier film 503, the electrode structure 504 and possibly one (not shown) cover layer can be arranged within the recess 510, at least in portions. Advantageously, the substrate 501 can also be arranged in the recess 510, wherein the wall 508 can be used as a lateral limitation against shifting of the substrate 501.

The wall 508 comprises a first breakthrough 511A. The breakthrough 511A is configured such that a first contacting portion 520A of the apparatus 500 can be placed therein. Additionally, the wall 508 comprises a second breakthrough 511B. The second breakthrough 511B is configured such that a second contacting portion 520B of the apparatus 500 can be placed therein.

Thus, the breakthroughs 511A, 511B are configured to receive the contacting portions 520A, 520B such that the same extend beyond the circumference of the substrate carrier 502. In that way, the contacting portions 520A, 520B remain accessible even when the apparatus 500 is arranged within the recess 510 provided in the substrate carrier 502. The contacting portions 520A, 520B or possibly further (not shown) contacting portions can also be provided inside the recess 510, i.e. the same would not extend beyond the outer circumference of the substrate carrier 510.

Figure 6:
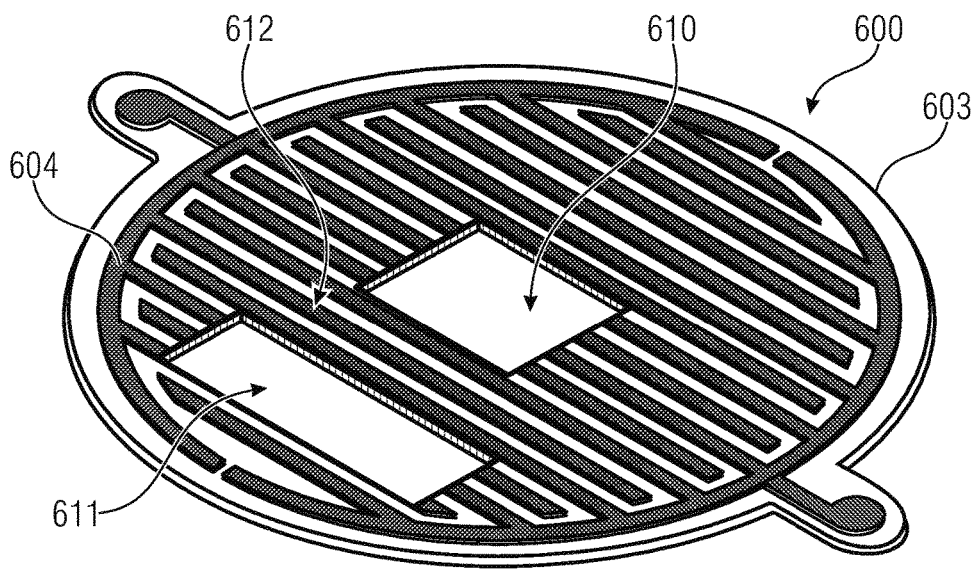
FIG. 6 is a perspective view of an inventive apparatus according to a further embodiment comprising recesses.

FIG. 6 shows a further embodiment of an inventive apparatus 600 having a flexible plastic carrier film 603 and an electrode structure 604 arranged thereon.

The apparatus 600 comprises a recess 610. The recess 610 extends completely through the apparatus 600. In other words, the recess 610 forms a hole in the apparatus 600. The apparatus 600 can have several recesses 610, 611. Accordingly, the electrode structure 604 extends on the residual components of the carrier film 603. In the case of several recesses 610, 611, ridges 612 remain on the carrier film 603. In that way, for example, a ridge 612 is formed between the recess 610 and the recess 611. The electrode structure 604 can be arranged on the ridges 612.

In the following, embodiments of the external contacts will be described in more detail with reference to FIGS. 7A to 7D.

Figure 7A:
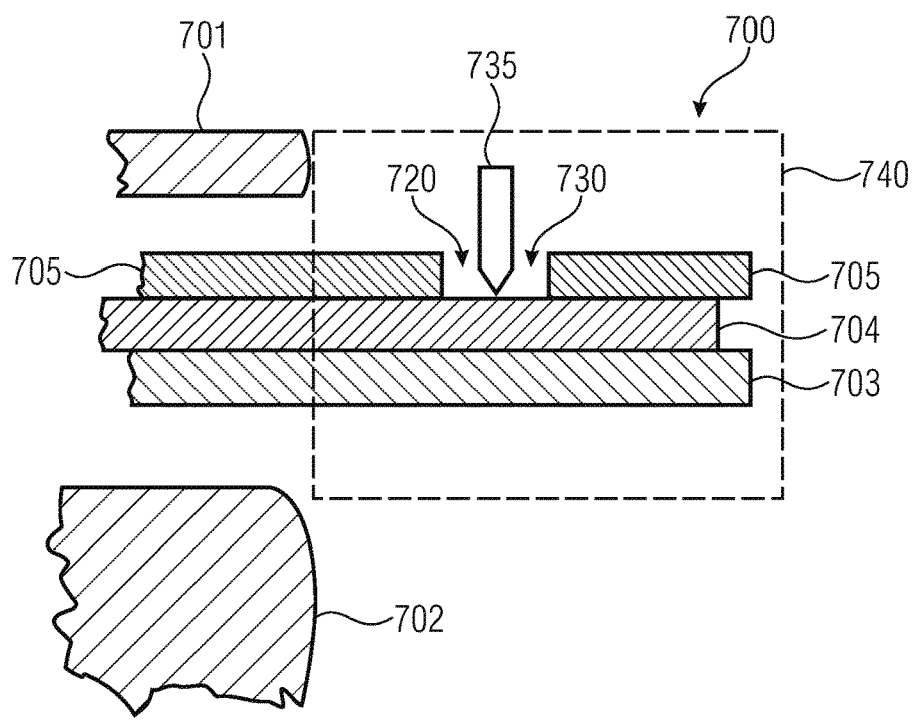
FIG. 7A is a section of a lateral sectional view of an inventive apparatus according to an embodiment having a recess provided in the cover layer.

FIG. 7A shows a section of an inventive apparatus 700 in the area of an electric external contact.

The apparatus 700 is arranged between a substrate 701 and a substrate carrier 702. The apparatus 700 comprises a flexible plastic carrier film 703 with an electrode structure 704 deposited thereon. A cover layer 705 is arranged on the side of the electrode structure 704 facing the substrate 701.

The cover layer 705 comprises a recess 730. The recess 730 is a material-free area within the cover layer 705. The recess 730 extends completely through the cover layer 705, i.e. the same extends up to the electrode structure 704 deposited below the same and thus exposes the same at least in sections. This exposed portion 720 of the electrode structure 704 can be used for contacting the electrode structure 704.

The recess 730 provided in the cover layer 705 is provided in the area of an external contact of the apparatus 700 illustrated by dashed lines 740. The electrode structure 704 can be contacted through the recess 730. It is, for example, possible that a pin 735 or contact pin 735 of a voltage source contacts the electrode structure 704 lying below through the recess 730.

Figure 7B:
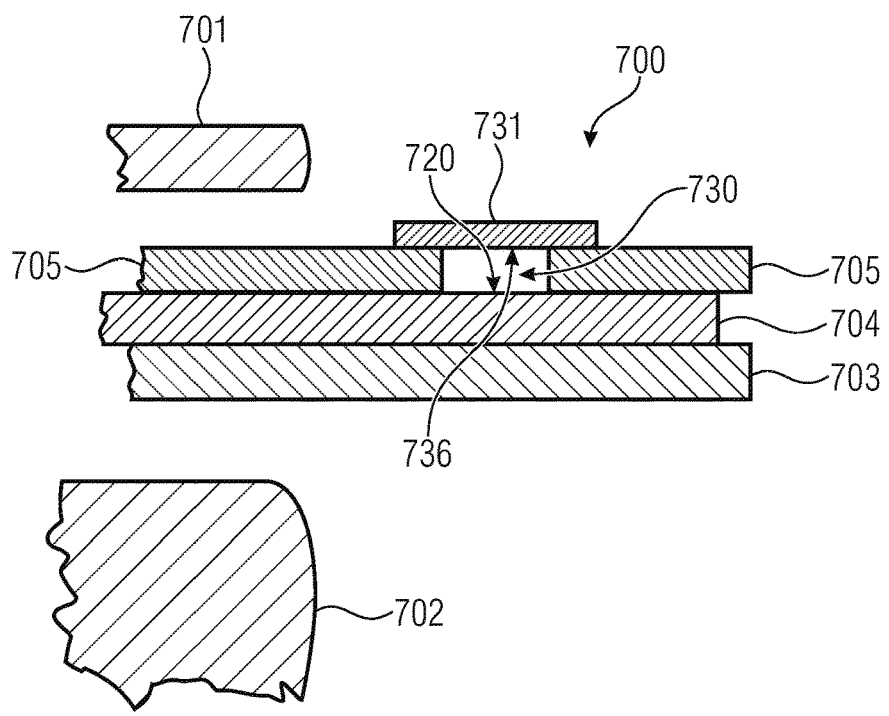
FIG. 7B is a section of a lateral sectional view of an inventive apparatus according to an embodiment having a contact layer.

FIG. 7B shows a further embodiment of the inventive apparatus 700. In the embodiment shown in FIG. 7B, the recess 730 is covered with a contact layer 731. The contact layer 731 can comprise a conductive or semiconductive material. In this embodiment, the apparatus 700 also comprises a contact layer 731 comprising a conductive or semiconductive material.

The contact layer 731 is arranged on the side of the cover layer 705 facing away from the electrode structure 704. The contact layer 731 covers the recess 730 provided in the cover layer 705 at least in sections. In the area of the recess 730, the contact layer 731 is arranged spaced apart from the electrode structure 704. Thus, a closed cavity 730 results between the contact layer 731, the cover layer 705 and the electrode structure 704.

Figure 7C:
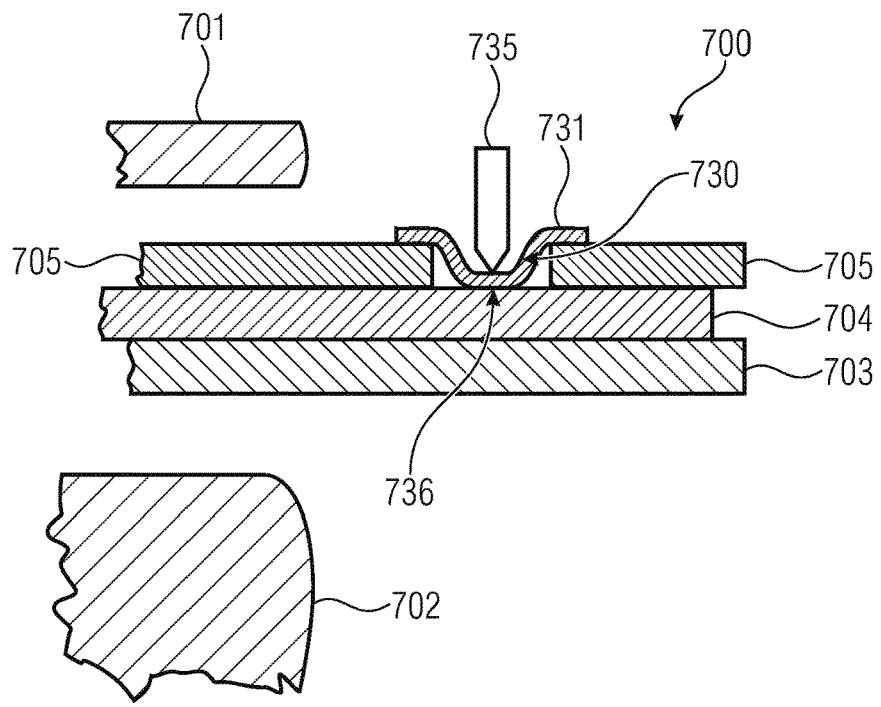
FIG. 7C is a section of a lateral sectional view of an inventive apparatus according to an embodiment of FIG. 7B with a pushed-through contact layer during contacting with a pin.

If now, as illustrated in FIG. 7C, a pin 735 or contact pin 735 that is connected to an external voltage source is pressed onto the contact layer 731, the air gap in the cavity 730 is compressed and an electric contact with an electrode structure 704 results. Thus, the electrode structure 704 can be charged. After lifting the contact pin 735, the contact layer 731 returns to the initial position illustrated in FIG. 7B, where the same is spaced apart from the electrode structure 704. Thus, the contact layer 731 remains isolated from the electrode structure 704 and the electrode structure 704 can thus not discharge, e.g. via the contact layer 731.

In other words, the contact layer 731 can be brought into contact with the electrode structure 704 in the area of the recess 730 when a force is applied to the contact layer 731 and/or onto the electrode structure 704.

Thus, the contact layer 731 comprises a contact portion 736 where the contact layer 731 can be brought into contact with the electrode structure 704. As can be seen in FIGS. 7B and 7C, this contact portion 736 is approximately arranged in the area of the recess 730.

In one embodiment, the contact layer 731 is formed as a thin stainless steel film adhered over the recess 730 provided in the cover layer 705. Stainless steel is well-suited since this material is mostly resistant against the chemicals used in wafer processing.

Figure 7D:
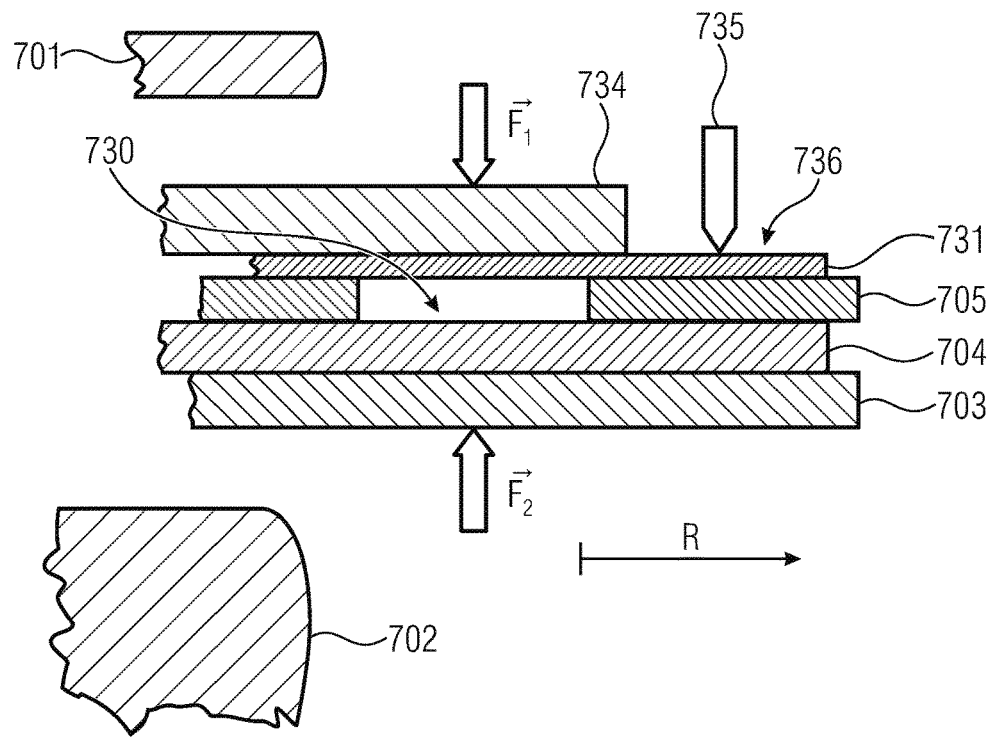
FIG. 7D is a section of a lateral sectional view of an inventive apparatus according to a further embodiment.

FIG. 7D shows a further embodiment of an inventive apparatus 700. The same illustrates again a section of the apparatus 700 in the area of an external contact.

This embodiment differs from the embodiments described above with reference to FIGS. 7A, 7B and 7C in particular in that the contact layer 731 comprises a contact portion 736 arranged spaced apart from the recess 730 in radial direction R. A pin 735 or contact pin 735 connected to a voltage source can then be brought into contact with the contact portion 736. In that way, the contact layer 731 becomes charged.

An insulating layer 734 is deposited approximately in the area of the recess 730. The insulating layer 735 is arranged on the side of the contact layer 731 facing the substrate 701 and isolates the contact layer 731 electrically to the outside. The insulation layer 735 can be made of the same material as the carrier film 703.

In order to transfer the charge carriers existing on the contact layer to the electrode structure 704 in order to charge same, the contact layer 731 has to be brought into contact with the electrode structure 704. In the area of the recess 730, the contact layer 731 and the electrode structure 704 can be brought into contact with one another.

For this, a force $F_1$ is applied to the insulating layer 734, which acts towards the bottom, i.e. in the direction of the electrode structure 704. Additionally or alternatively, a force $F_2$ can be applied to the electrode structure 704, which acts towards the top, i.e. in the direction of the contact layer 731. In that way, the charged contact layer 731 and the electrode structure 704 come into contact with one another, similar to the embodiment shown in FIG. 7C and the charge carriers are transferred from the contact layer 731 to the electrode structure 704.

In other words, on the one hand, the contact layer 731 can be contacted, e.g. by a pin 735, at a contact portion 736 spaced apart radially from the recess 730, and on the other hand, the same can be brought into contact with the electrode structure 704 in the area of the recess 730 when a force $F_1$, $F_2$ is applied to the contact layer 731 and/or to the electrode structure 704.

Thus, the contact portion 736 for charging is geometrically separated from the recess 730 provided in the cover layer 705. In that way, for charging, both the contact pin 735 has to be placed onto the contact portion 736 and the cavity 730 has to be mechanically pushed through. This can be advantageous, e.g. because accidental discharge when "touching" the electrostatic apparatus is prevented. It is unlikely that a person when touching the apparatus 700 operates both contacts 736, 730 simultaneously such that a discharge could occur.

In one embodiment, the contact layer 731 is implemented as an insulating layer with a unilaterally conductive coating, e.g. with a metal layer. In this case, the unilaterally conductive coating is on the bottom side, i.e. on the side of the contact layer 731 facing the electrode structure 704. Thus, the contact layer 731 would be electrically conductive on the side facing the electrode structure 704 and electrically insulated to the outside on the side facing away from the electrode structure 704. In this case, providing an insulating layer 734 would be optional.

Figure 7E:
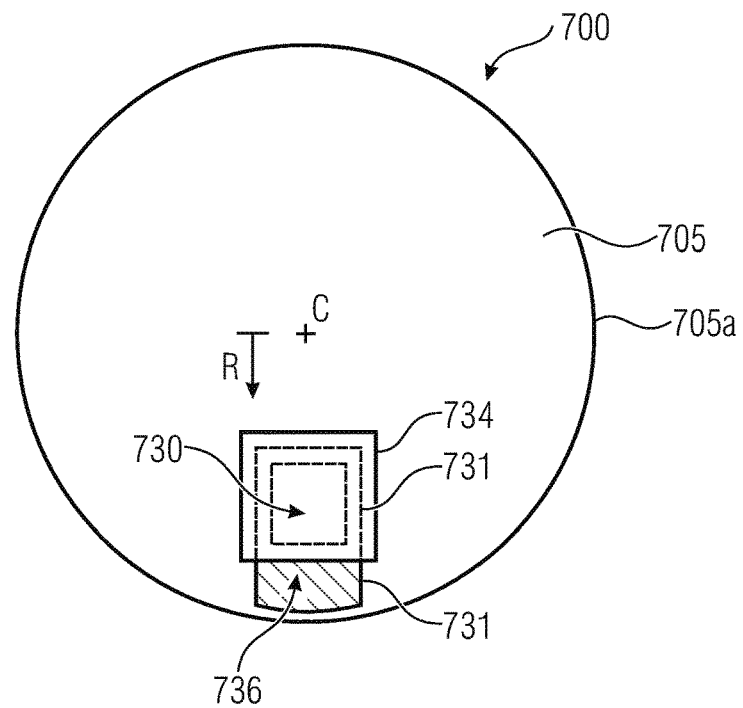
FIG. 7E is a top view of the embodiment of FIG. 7D.

FIG. 7E shows the embodiment discussed with reference to FIG. 7D in a top view. In this embodiment, the cover layer 705 projects furthest to the outside in a radial direction. Thus, merely the outlines 705a of the cover layer 705 can be seen. The cover layer 705 covers the layers lying below the same.

The cover layer 705 comprises a recess 730. A contact layer 731, which covers the recess 730 at least in sections, is disposed on the cover layer 705, as explained above with reference to FIG. 7D. For that reason, the recess 730 is shown in dashed lines in FIG. 7E.

An insulating layer 734 is arranged over the contact layer 731 and covers the contact layer 731 at least in sections. The portion of the contact layer 731 covered by the insulating layer 734 is illustrated in dashed lines in FIG. 7E. The exposed portion 736 of the contact layer 731 is exposed and accessible from the outside and can hence be contacted, e.g. with a pin 735. The exposed portion 736 forms the contact portion 736 and is illustrated in a hatched manner in FIG. 7E.

For charging the electrode structure 704, on the one hand, the contact portion 706 has to be contacted, e.g. with a pin 735. On the other hand, the contact layer 731 also has to be brought into contact with the electrode structure 704 by applying a force in the direction of the same. For this, for example, a pressure can be applied to the apparatus 700 in the area of the recess 730.

The apparatus 700 comprises a center C. It can be seen that the recess 730 and the contact portion 736 are arranged spaced apart from one another in radial direction R seen from that center.

Here, the contact layer 731 and the insulating layer 734 are formed in stripes and are mounted on the round cover layer 705.

Figure 7F:
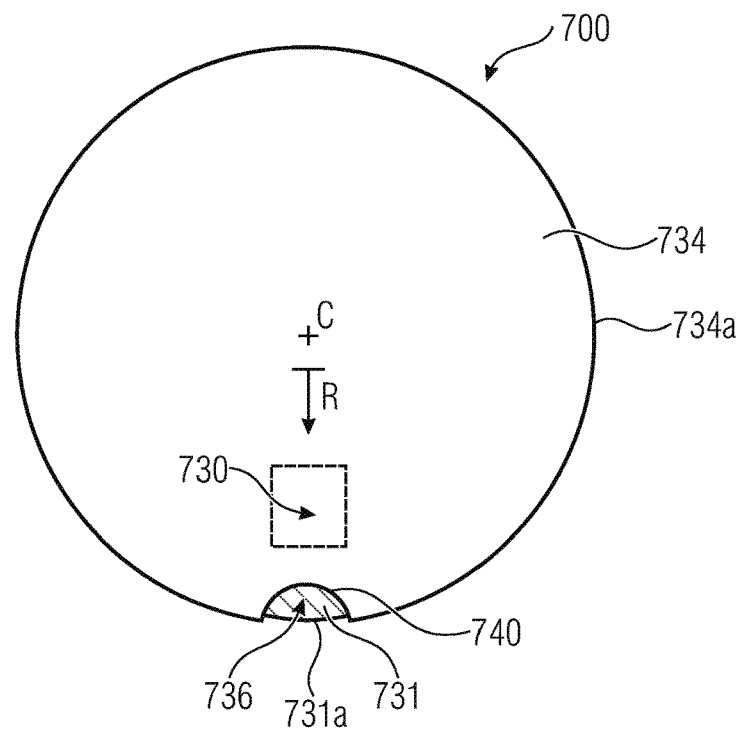
FIG. 7F is a top view of a further embodiment of an inventive apparatus.

FIG. 7F shows an alternative embodiment in a top view. In this embodiment, the insulating layer 734 projects furthest to the outside in radial direction. Thus, here, merely the outlines 734a of the insulating layer 734 can be seen.

The contact layer 731 is arranged below the insulating layer 734 as discussed with reference to FIGS. 7D and 7E. Here, the contact layer 731 is covered by the insulating layer 734 lying above the same at least in sections. As discussed before with reference to FIG. 7E, the contact layer 731 can be formed in stripes. Alternatively, the contact layer 731 can also be formed in a circular shape and can extend below the visible insulating layer 734.

This can be seen to some extent in FIG. 7F. The insulating layer 734 comprises, for example, a recess 740. The recess 740 extends from the outer edge 734a of the insulating layer 734 radially towards the inside and hence exposes a portion 736 of the contact layer 731 lying below the same. This portion 736 can be contacted by a pin 735 and hence forms a contact portion 736.

In FIG. 7F, an outer edge 731a of the contact layer 731 can be seen. Here, the diameter of the contact layer 731 is lower than the diameter of the insulating layer 734 arranged above the same. Thus, with the exception of the recess 740, the contact layer 731 is covered by the insulting layer 734 and insulated towards the outside by the insulating layer 734.

For charging the electrode structure 704, on the one hand, the contact portion 736 has to be contacted, e.g. with a pin 735. On the other hand, the contact layer 731 has to be brought into contact with the electrode structure 704 by applying a force in the direction of the same. For this, for example, pressure can be applied to the apparatus 700 in the area of the recess 730.

In this embodiment, the recess 730 and the contact portion 736 are also arranged spaced apart from one another in radial direction R seen from the center C.

Figure 7G:
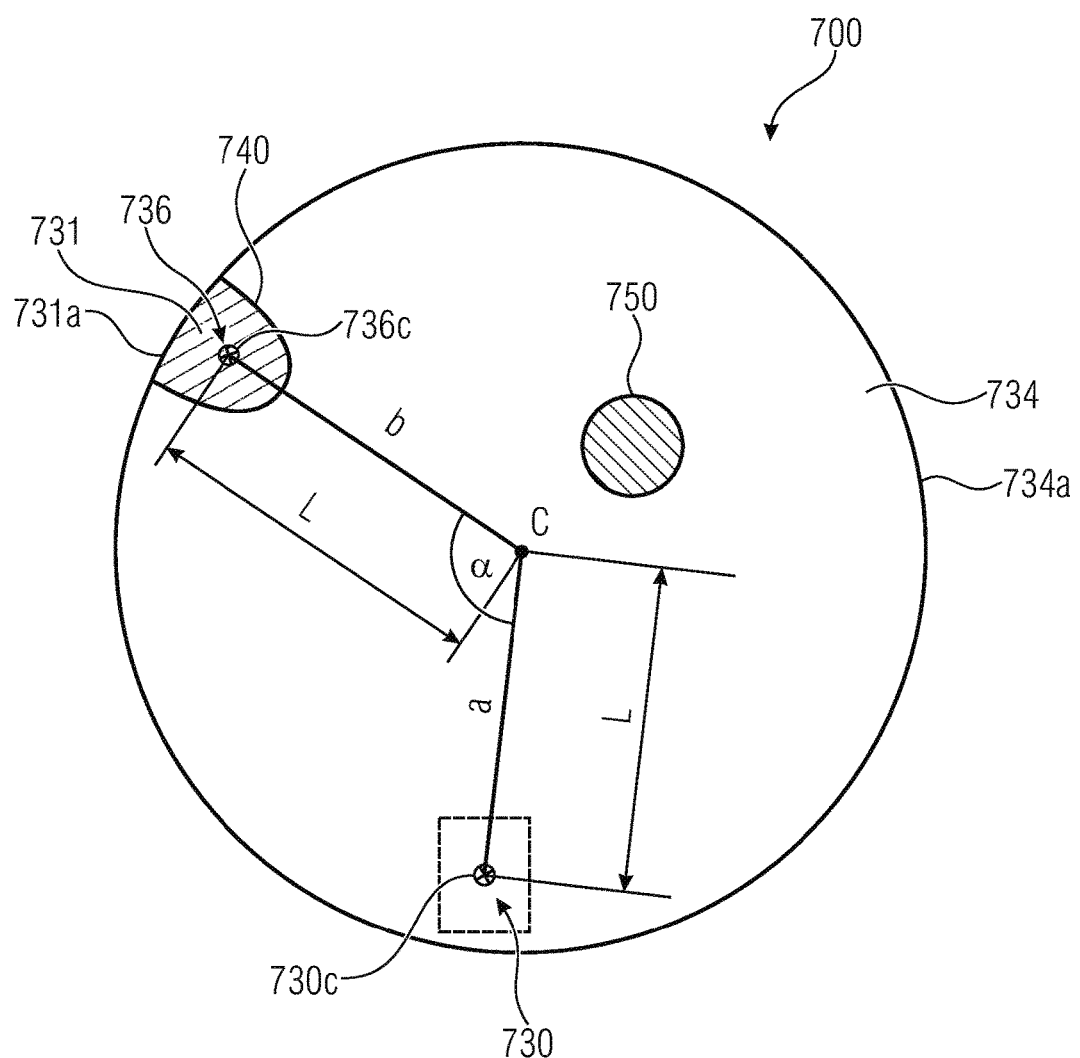
FIG. 7G is a top view of a further embodiment of an inventive apparatus.

FIG. 7G shows a further embodiment of an inventive apparatus 700 in a top view. In this embodiment, the insulating layer 734 and the contact layer 731 disposed below the same have approximately the same diameter. In a top view, thus, merely the outlines 734a of the insulating layer 734 can be seen.

The contact layer 731 is arranged below the insulating layer 734, as discussed with reference to FIGS. 7D, 7E and 7F. Here, the contact layer 731 is covered at least in sections by the insulating layer 734 lying above the same. As discussed above with reference to FIG. 7E, the contact layer 731 can be formed in stripes. Alternatively, as discussed with reference to FIG. 7, the contact layer 731 can also be formed in a circular shape and can extend below the visible insulating layer 734.

This can be seen to some extent in FIG. 7G. The insulating layer 734 comprises a recess 740. The recess 740 extends from the outer edge 734a of the insulating layer 734 radially towards the inside and hence exposes a portion 706 of the contact layer 731 lying below the same. This portion 736 can be contacted by a pin 735 and hence forms a contact portion 736.

In FIG. 7G, an outer edge 731a of the contact layer 731 can be seen. The diameter of the contact layer 731 is of approximately the same size as the diameter of the insulating layer 734 arranged on top of the same. Thus, with the exception of the recess 740, the contact layer 731 is covered by the insulating layer 734 and insulated towards the outside by the insulating layer 734.

For charging the electrode structure 704, on the one hand, the contact portion 736 has to be contacted, e.g. with a pin 735. On the other hand, the contact layer 731 also has to be brought into contact with the electrode structure 704 by applying a force in the direction of the same. For this, for example, a pressure can be applied to the apparatus 700 in the area of the recess 730.

Compared to the above discussed embodiments, in FIG. 7G, the recess 730 and the contact portion 736 are arranged offset to one another by an angle α along the circumference of the apparatus 700.

The apparatus 700 comprises a center C. The center 736c of the contact portion 736 is spaced apart by the distance b from the center C of the apparatus 700. The center 730c of the recess 730 is spaced apart from the center C of the apparatus 700 by the distance a. Here, the distance a and the distance b have the same lengths. Thus, the contact portion 736 and the recess 730 have the same distance from the center C in radial direction.

However, it is also possible that one of the two distances a, b is shorter than the other one of the two distances a, b. In that way, as discussed above with reference to FIGS. 7D to 7F, the recess 730 would be arranged spaced apart from the contact portion 736 in radial direction, in addition to the illustrated angular offset by the angle α.

Generally, in the embodiments according to FIGS. 7D to 7G, the contact portion 736 can be arranged closer to the center C of the apparatus 700 in radial direction R than the recess 730. This means the recess would be arranged further outside than the contact portion 736 and the contact portion 736 could be provided, for example in the shape of a hole in the insulating layer 734, as indicated by the hole 750.

According to the invention, the electrostatically activatable electrode structures are to be produced on a thin film substrate (carrier film). Such an apparatus can effect electrostatic holding force in both directions. Thus, the same can be placed, e.g. between a thin fragile or flexible substrate and a rigid carrier plate. After charging the electrode structures, the apparatus holds the substrate stack together.

For using the inventive apparatus, a voltage source is connected. Depending on whether the apparatus comprises a unipolar or bipolar electrode structure, the poles of the voltage source are connected to the unipolar electrode structure and the substrate or the substrate carrier, or one of the two poles of the voltage source each is connected to one bipolar electrode structure each.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus for electrostatic coupling of a substrate with a substrate carrier, the apparatus comprising:
   a flexible plastic carrier film on which an electrically contactable electrode structure is unilaterally deposited, and
   a cover layer which can be brought into contact with electrode structure on the side of the electrode structure facing away from the carrier film, wherein the cover layer is an insulating layer which is mounted on the electrode structure or on the side of the substrate or the substrate carrier facing the electrode structure,
   wherein the apparatus is configured such that, in a coupled state, the same is arranged at least in sections between the substrate and the substrate carrier and, in a non-coupled state, the same can be removed from the substrate carrier in a reusable manner.

2. The apparatus according to claim 1, wherein the carrier film and the electrode structure deposited thereon together comprise a thickness of less than 200 μm, of less than 100 μm or of less than 70 μm.

3. The apparatus according to claim 1, wherein the carrier film comprises one of the plastics polyimide, polyether ether ketone, polyethylene naphthalate, liquid crystalline LCP polymer or polyethylene terephthalate.

4. The apparatus according to claim 1, wherein the electrode structure comprises a metal, a conductive polymer, a doped semiconductor layer or an organic conductor.

5. The apparatus according to claim 4, wherein the metal is provided as coating or as film, in particular a stamped metal film.

6. The apparatus according to claim 1, wherein the apparatus comprises a further layer comprising metal, wherein the metal is provided as coating or as film.

7. The apparatus according to claim 4, wherein the metal comprises copper.

8. The apparatus according to claim 1, wherein the cover layer is configured as plastic film comprising the same material and/or approximately the same thickness as the plastic carrier film.

9. The apparatus according to claim 1, wherein the electrode structure is divided into at least two electrically contactable electrode areas, wherein the electrode areas are arranged in the same plane.

10. The apparatus according to claim 1, wherein the electrode structure is arranged in a first plane and wherein the apparatus comprises at least one second electrically contactable electrode structure that is arranged in a second plane differing from the first plane.

11. The apparatus according to claim 10, wherein the second electrode structure is divided into at least two electrically contactable electrode areas, wherein the electrode areas are arranged in the same plane.

12. The apparatus according to claim 10, wherein an insulating layer is arranged between the first and second electrode structures, wherein the insulating layer comprises a thickness that is greater than the thickness of the carrier film and/or the thickness of the cover layer.

13. The apparatus according to claim 1, wherein the electrode structure comprises a contacting portion that projects at least in sections beyond the outer circumference of the substrate and/or the substrate carrier, such that the contacting portion is accessible from the outside when the apparatus is arranged between the substrate and the substrate carrier.

14. The apparatus according to claim 1, wherein the electrode structure comprises a contacting portion that is configured such that the electrode structure is electrically insulated towards the outside when the contacting portion is contacted.

15. The apparatus according to claim 1, wherein the electrode structure comprises a contacting portion, and wherein the cover layer comprises a recess in the area of the contacting portion, such that the contacting portion can be contacted through the recess.

16. The apparatus according to claim 15, wherein the apparatus comprises a contact layer comprising a conductive or semiconductive material, which is arranged on a side of the cover layer facing away from the electrode structure and that covers the recess provided in the cover layer at least in sections, and wherein the contact layer is arranged spaced apart from the electrode structure in the area of the recess.

17. The apparatus according to claim 16, wherein the contact layer can be brought into contact with the electrode structure in the area of the recess when a force is applied to the contact layer and/or to the electrode structure.

18. The apparatus according to claim 16, wherein the apparatus comprises a center and wherein the contact layer comprises a contact portion that is arranged spaced apart from the recess in radial direction starting from the center and/or arranged along a circumference of the apparatus offset from the recess by an angle α.

19. The apparatus according to claim 1, wherein the carrier film, the electrode structure and the cover layer are configured such that the same can be arranged in a recess provided in the substrate carrier at least in sections.

20. The apparatus according to claim 19, wherein a contacting portion of the electrode structure is configured such that the same can be arranged in a breakthrough provided in a wall circumventing laterally along the recess and extends beyond the circumference of the substrate carrier.

21. The apparatus according to claim 1, wherein the apparatus comprises a recess that extends completely through the apparatus.

22. A substrate stack comprising a substrate, a substrate carrier and an apparatus according to claim 1 arranged between the substrate and the substrate carrier.

23. Usage of an apparatus according to claim 1, comprising:
- arranging the apparatus between the substrate and the substrate carrier, and
- applying a DC voltage between the electrode structure and the substrate and/or between the electrode structure and the substrate carrier, or
- applying a DC voltage between first and second electrode structures or between first and a second electrode areas when the apparatus comprises at least two electrode structures and/or at least two electrode areas.

* * * * *